US011550974B2

(12) United States Patent
Samson et al.

(10) Patent No.: US 11,550,974 B2
(45) Date of Patent: Jan. 10, 2023

(54) DYNAMIC RESERVOIR CHARACTERIZATION

(71) Applicant: Schlumberger Technology Corporation, Sugar Land, TX (US)

(72) Inventors: Barys Samson, Piddington (GB); Aleksandr Bogush, Didcot (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 356 days.

(21) Appl. No.: 16/719,985

(22) Filed: Dec. 19, 2019

(65) Prior Publication Data

US 2020/0202056 A1 Jun. 25, 2020

Related U.S. Application Data

(60) Provisional application No. 62/784,423, filed on Dec. 22, 2018.

(51) Int. Cl.
*G06F 30/27* (2020.01)
*G01V 1/30* (2006.01)
*G06F 30/17* (2020.01)

(52) U.S. Cl.
CPC ............. *G06F 30/27* (2020.01); *G01V 1/307* (2013.01); *G01V 2210/6244* (2013.01); *G06F 30/17* (2020.01)

(58) Field of Classification Search
CPC ...... E21B 2200/20; G06F 30/27; G06F 30/00; G06F 30/17; G01V 1/307; G01V 2210/6244; G01V 1/30; G01V 99/005
USPC ........................................................ 703/10, 6
See application file for complete search history.

(56) References Cited

U.S. PATENT DOCUMENTS

2012/0179443 A1 7/2012 Van Batenburg et al.
2015/0100293 A1 4/2015 Hoteit et al.

FOREIGN PATENT DOCUMENTS

WO 2012015516 A1 2/2012
WO WO-2012015516 A1 * 2/2012 ............. E21B 43/00

OTHER PUBLICATIONS

Janiga, Damian et al., "Performance of Nature Inspired Optimization Algorithms for Polymer Enhanced Oil Recovery Process", Apr. 11, 2017, Journal of Petroleum Science and Engineering 154, Elsevier B.V. (Year: 2017).*

(Continued)

*Primary Examiner* — Cedric Johnson

(57) ABSTRACT

A method of operating a reservoir simulator can include performing a time step of a reservoir simulation using a spatial reservoir model that represents a subterranean environment that includes a reservoir to generate simulation results for a first time where the simulation results include a front defined by at least in part by a gradient at a position between portions of the spatial reservoir model; predicting a position of the front for a subsequent time step for a corresponding second time using a trained machine model; discretizing the spatial reservoir model locally at the predicted position of the front to generate a locally discretized version of the spatial reservoir model; and performing a time step of the reservoir simulation using the locally discretized version of the spatial reservoir model to generate simulation results for the second time.

20 Claims, 16 Drawing Sheets

(56) References Cited

OTHER PUBLICATIONS

Nwachukwu, Azor et al., "Machine Learning-Based Optimization of Well Locations and WAG Parameters under Geologic Uncertainty", Apr. 14-18, 2018, SPE Improved Oil Recovery Conference, Society of Petroleum Engineers. (Year: 2018).*

Armacanqui, Dr. J. Samuel et al., "The Use of an Operational Filter Boosted Artificial Neural Network for Selection of Enhanced Oil Recovery Technique", Sep. 14-16, 2015, SPE North Africa Technical Conference and Exhibition, Society of Petroleum Engineering. (Year: 2015).*

"Azure Machine Learning," retrieved at https://azure.microsoft.com/en-gb/services/machine-learning/ on Dec. 18, 2019.

Bentley, "Multidimensional binary search trees used for associative searching," in Communications of the ACM, 18, (9), pp. 509-517, 1975.

Berger, et al., "Local Adaptive Mesh refinement for shock hydrodynamics," Journal of Computational Physics. 82, pp. 64-84, 1989.

Christensen, et al. "Applications of Dynamic Gridding to Thermal Simulations," SPE International Thermal Operations and Heavy Oil Symposium and Western Regional Meeting held in Bakersfield, California, USA, Mar. 16-18, 2004.

Cusini, et al., "Algebraic dynamic multilevel (ADM) method for fully implicit simulations of multiphase flow in porous media," Journal of Computational Physics, 314, pp. 60-79, 2016.

Gonzalez, "Adaptive Grid Refinement Improves Gas Injection Modeling," SPE International Student Paper Contest at the SPE Annual Technical Conference and Exhibition held in Dubai, UAE, Sep. 26-28, 2016.

Hornung, et al., "Adaptive Mesh Refinement and Multilevel Iteration for Flow in Porous Media," Journal of Computational Physics. 136, pp. 522-545, 1997.

Mostaghimi, et al., "A Dynamic Mesh Approach for Simulation of Immiscible Viscous Fingering," SPE Reservoir Simulation Symposium held in Houston, TX USA Feb. 23-25, 2015.

Sammon. "Dynamic Grid Refinement and Amalgamation for Compositional Simulation," SPE Reservoir Simulation Symposium held in Houston, TX, USA, Feb. 3-5, 2003.

van Batenburg, et al., "Application of Dynamic Gridding Techniques to IOR/EOR-Processes," SPE Reservoir Simulation Symposium held in the Woodlands, TX USA Feb. 21-23, 2011.

Wikipedia, "Artificial neural network," retrieved at https://en.wikipedia.org/wiki/Artificial_neural_network on Dec. 18, 2019.

Wikipedia, "Machine learning," retrieved at https://en.wikipedia.org/wiki/Machine_learning on Dec. 18, 2019.

Wikipedia, "Regression Analysis," retrieved at https://en.wikipedia.org/wiki/Regression_analysis on Dec. 18, 2019.

Lavie et al., "An Evaluation of Criteria for Dynamic Gridding during Reservoir Simulation of Water Flooding and Solvent Injection," SPE 141796-PP, SPE Reservoir Simulation Symposium held in The Woodlands, Texas, USA, Feb. 21 to 23, 2011, 9 pages.

Extended European search report issued in the equivalent European Patent Application No. 19217871.3 dated May 26, 2020, 10 pages.

Communication pursuant to Article 94(3) issued for the equivalent European Patent Application No. 19217871.3 dated Apr. 14, 2021, 4 pages.

* cited by examiner

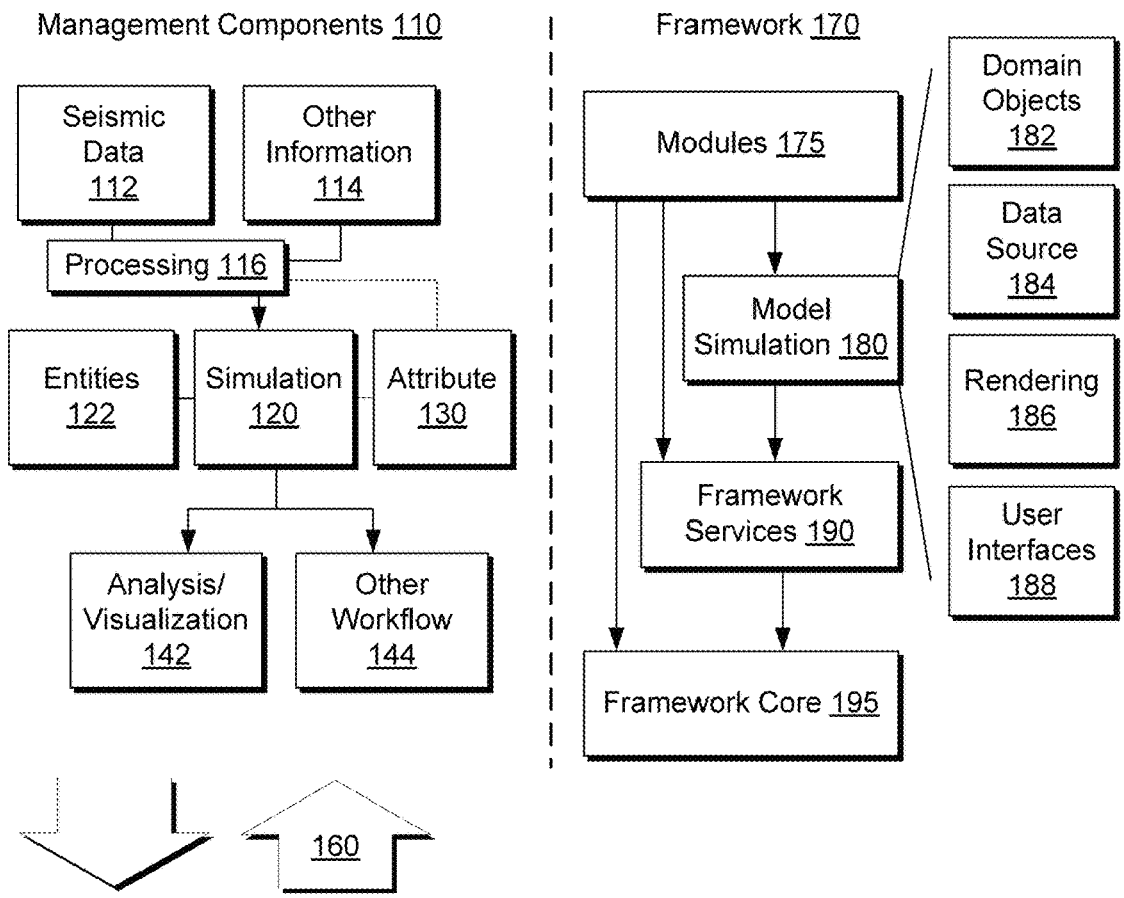
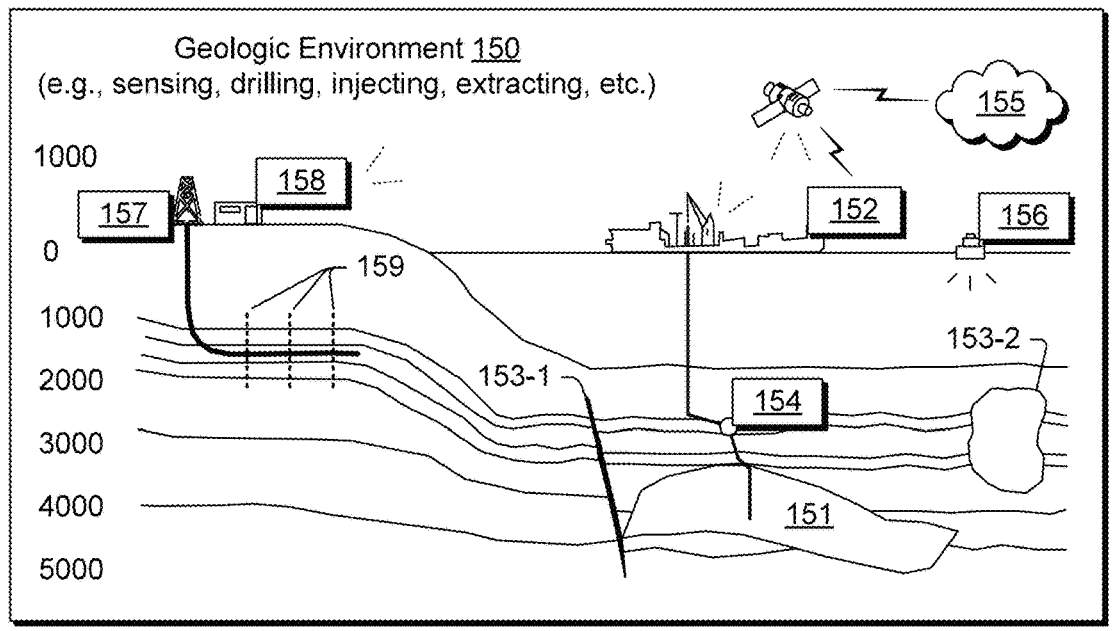
Fig. 1

312  $H_g = \dfrac{S_g}{S_g + S_w - S_{wco}}$

314  $H_w = \dfrac{S_w - S_{wco}}{S_g + S_w - S_{wco}}$

316  $k_{ro} = k_{rog} H_g + k_{row} H_w$

Method 410
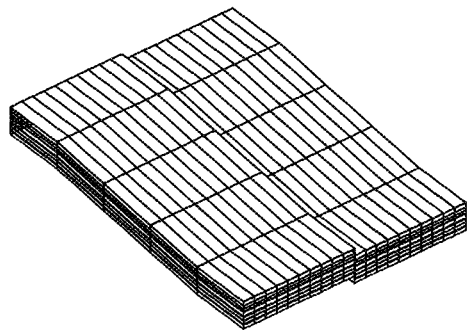
GRID, EDIT Sections
420
Calculate Pore Volumes, Transmissibilities, Depths and NNCs.
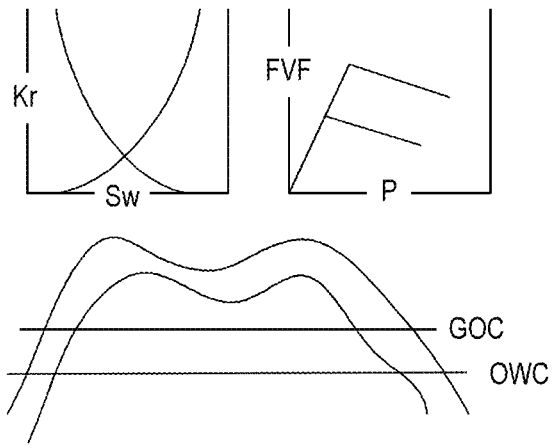
PROPS, REGIONS, SOLUTION Sections
440
Initialize, calculate initial saturations, pressures and fluids in place
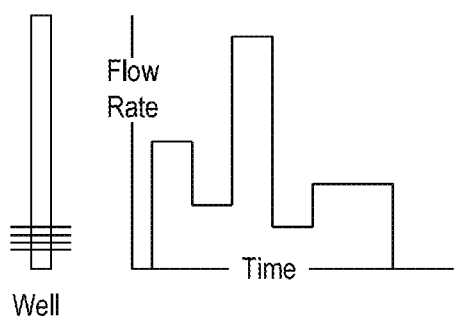
SCHEDULE Section
460
Define wells and surface facilities. Advance through time by material balance for ind. cells with wells as sinks or sources
Fig. 4

Method 500

Performing a time step of a reservoir simulation using a spatial reservoir model that represents a subterranean environment that comprises a reservoir to generate simulation results for a first time where the simulation results include a front defined by at least in part by a gradient at a position between a first portion and a second portion of the spatial reservoir model
510

CRM 511

Predicting a position of the front for a subsequent time step for a corresponding second time using a trained machine model
520

CRM 521

Discretizing the spatial reservoir model locally at the predicted position of the front to generate a locally discretized version of the spatial reservoir model
530

CRM 531

Increment Time

Performing a time step of the reservoir simulation using the locally discretized version of the spatial reservoir model to generate simulation results for the second time
540

CRM 541

Fig. 5

Grid 1010
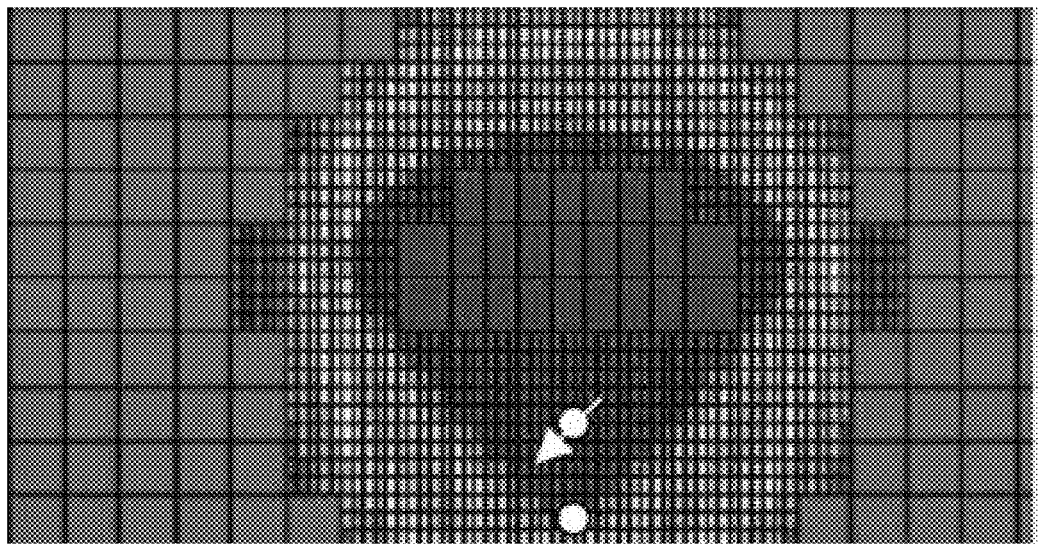
Grid 1030
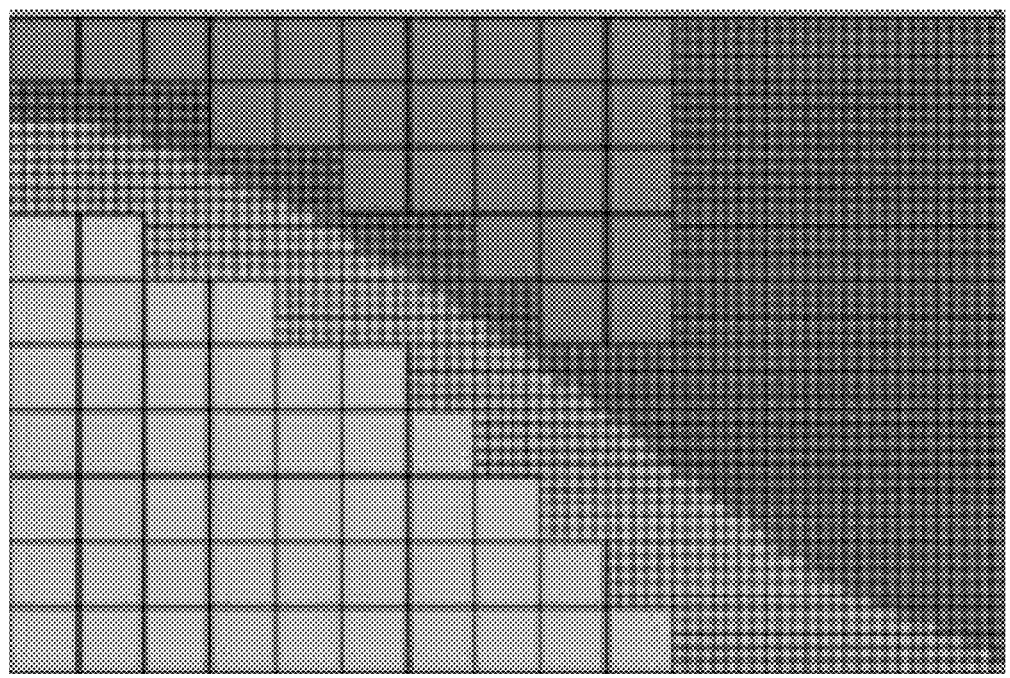
Fig. 10

Grids 1100

Grids 1410
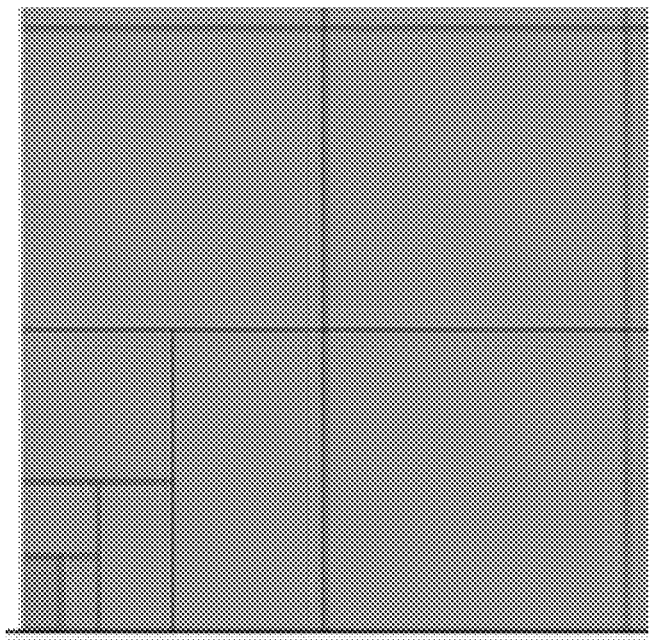
Grids 1430
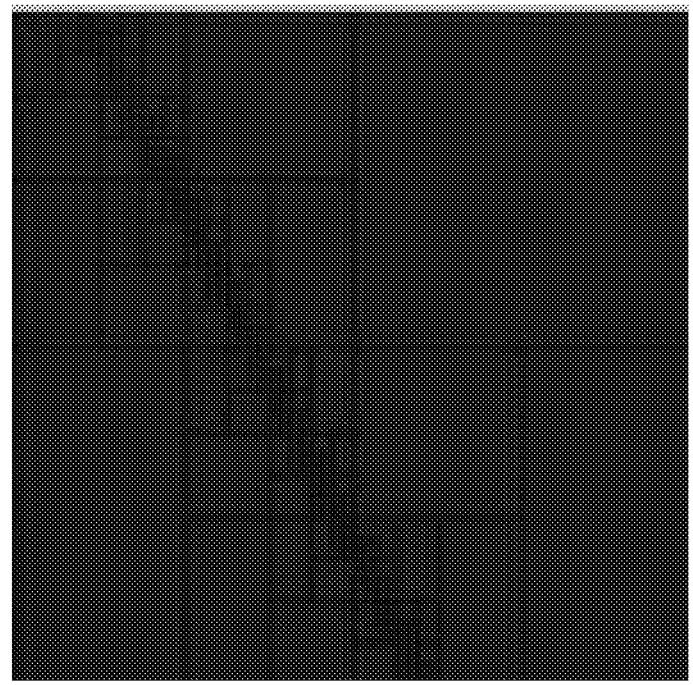
Fig. 14

Grid 1510
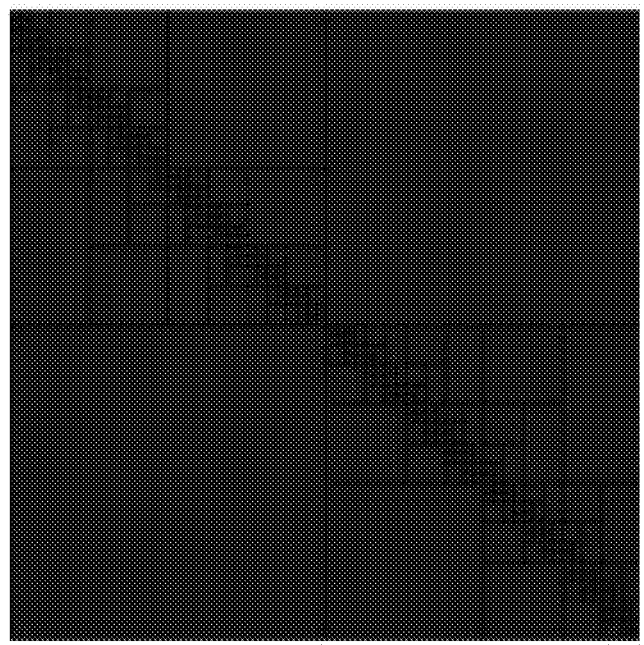
Plot 1530
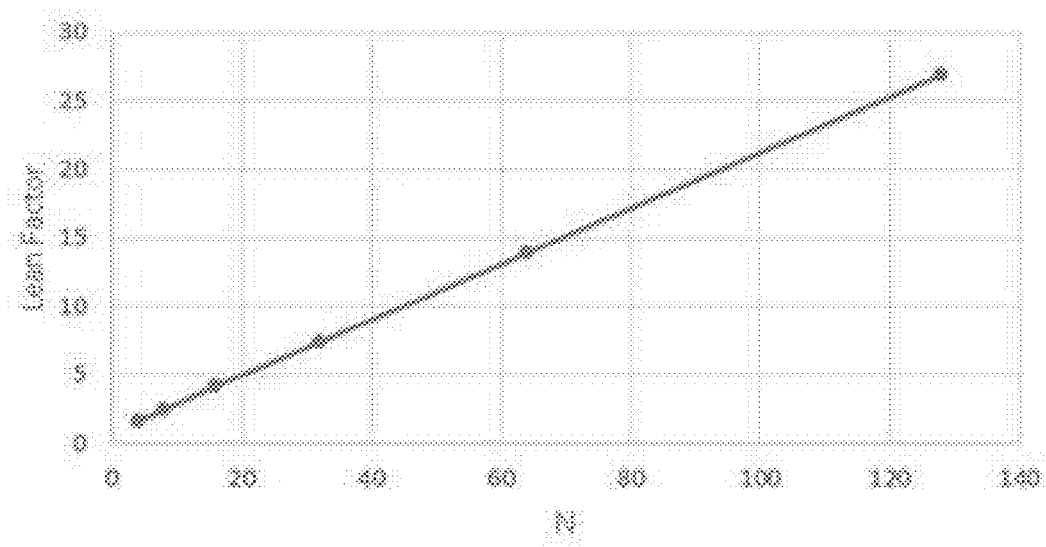
Fig. 15

DYNAMIC RESERVOIR CHARACTERIZATION

CROSS REFERENCE TO RELATED APPLICATIONS

This application claims the benefit of priority to U.S. Provisional Patent Application 62/784,423, filed on Dec. 22, 2018, the entire content of which is incorporated herein by reference.

BACKGROUND

A reservoir may be a subsurface body of rock that includes sufficient porosity and permeability to store and transmit fluids. As an example, sedimentary rock may possess more porosity than various types of igneous and metamorphic rocks. Sedimentary rock may form under temperature conditions at which hydrocarbons may be preserved. A reservoir may be a component of a so-called petroleum system. A geologic environment may be a sedimentary basin that may include one or more fluid reservoirs.

SUMMARY

A method of operating a reservoir simulator can include performing a time step of a reservoir simulation using a spatial reservoir model that represents a subterranean environment that includes a reservoir to generate simulation results for a first time where the simulation results include a front defined by at least in part by a gradient at a position between portions of the spatial reservoir model; predicting a position of the front for a subsequent time step for a corresponding second time using a trained machine model; discretizing the spatial reservoir model locally at the predicted position of the front to generate a locally discretized version of the spatial reservoir model; and performing a time step of the reservoir simulation using the locally discretized version of the spatial reservoir model to generate simulation results for the second time. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates an example system that includes various components for modeling a geologic environment and various equipment associated with the geologic environment;

FIG. 4 illustrates an example of a method;

FIG. 5 illustrates an example of a method;

FIG. 10 illustrates examples of grids and data as to different types of physical phenomena;

FIG. 14 illustrates examples of grids;

FIG. 15 illustrates an example of a grid and an example plot; and

DETAILED DESCRIPTION

Figure 2:
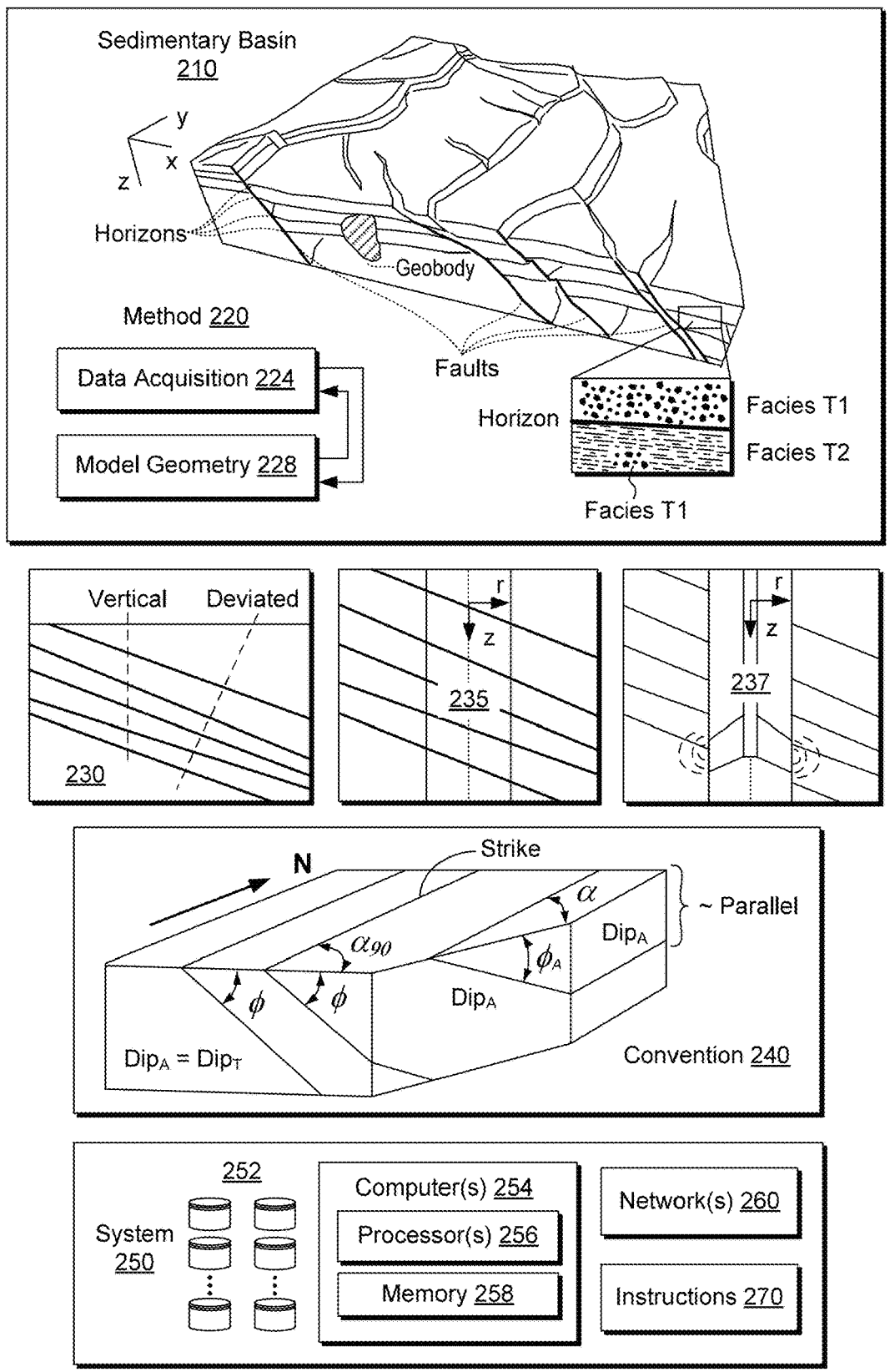
FIG. 2 illustrates an example of a sedimentary basin, an example of a method, an example of a formation, an example of a borehole, an example of a borehole tool, an example of a convention and an example of a system.

This description is not to be taken in a limiting sense, but rather is made merely for the purpose of describing the general principles of the implementations. The scope of the described implementations should be ascertained with reference to the issued claims.

A reservoir can be a subsurface body of rock that includes sufficient porosity and permeability to store and transmit fluids. A dynamic reservoir simulator, as a computational tool to characterize a reservoir based at least in part on field data (e.g., seismic data, satellite data, wellbore data, etc.), can simulate physical phenomena that can occur in a reservoir, which may be a reservoir in a sedimentary basin (e.g., a geologic environment). In reservoir simulation, multiphase flow effects through a porous medium (e.g. or porous media) may be determined via saturations that may, for example, characterize relative permeability of one phase given saturation of one or more other phases. As an example, tabulated functions for saturations may be prepared for various facies within a reservoir. In such an example, where a reservoir simulation uses a grid cell model, various cells within the grid cell model may be assigned common values (e.g., via values determined using tabulated functions, tabulated function values, etc.).

As an example, an oil recovery process can include one or more recovery phases, which can be categorized, for example, as primary, secondary, and tertiary recovery phases. In a primary oil recovery phase, oil can be driven by natural pressure of a reservoir. As an example, natural movement of oil may be enhanced with artificial lift techniques such as pumps (e.g., electric submersible pumps, etc.). As an example, an oil extraction range as to primary recovery may be from about 10 percent to about 20 percent of the oil available in the field. A secondary recovery phase may employ water in a process known as waterflooding to help recover oil from the field. Waterflooding can involve injection of water and/or steam that aims to displace oil and direct it to a wellbore (s). As an example, an additional 10 percent to about 30 percent recovery of oil from the available oil field may be possible via implementation of a secondary recovery phase. As to a tertiary oil recovery or enhanced oil recovery (EOR) phase, it may utilize one or more additional processes, which can be more complex as to types of equipment, materials, operation, etc. Proper application of one or more tertiary phase processes may enhance oil recovery to about 30 percent to about 60 percent of a total oil field.

As may be appreciated, water-based (e.g., including steam-based) techniques can introduce water into a field, which can be considered new water as water can already exist in a field. New water can complicate processing of recovered oil where a produced oil includes water, which may include an increasing fraction of water depending on one or more types of recovery phase processes utilized. For example, new water introduced during waterflooding can increase water fraction during recovery, which may demand separation of oil and water during further processing of produced oil fluid(s).

In the field of chemical enhanced oil recovery (chemical EOR), one or more types of chemicals can be used to increase a recovery factor of a field. Such chemicals may be referred to as chemical agents, which can include surface active agents, known as surfactants. Surfactants can lower surface tension (e.g., interfacial tension) between two liquids or between a liquid and a solid. Surfactants may act as detergents, wetting agents, emulsifiers, foaming agents, and dispersants.

As an example, in microemulsion forming recovery process, an oil reservoir can be flooded with water that includes surfactant and other additives. Such a solution may react with natural acids in trapped oil to facilitate microemulsion formation. Surfactant selection can play a role in determining what type of microemulsion or microemulsions form, which can help to diminish the interfacial tension (IFT) as to targeted oil.

As an example, where waterflooding has been successful, microemulsion flooding tends to be applicable; while, in instances where waterflooding has not readily benefited production, microemulsion flooding may still be employed and productive via microemulsion enhanced mobility.

As an example, a microemulsion process may aim to form a microemulsion slug that can travel in a reservoir from an injection well toward a production well. Formulation of a microemulsion slug for a particular reservoir can depend on various factors, including characteristics of a reservoir, which may be affected by one or more prior recovery processes (e.g., waterflooding, etc.). A microemulsion process can depend on one or more of, for example, temperature, salinity, crude oil type, etc.

Surfactants may be classified as natural, synthetic, organic, inorganic, etc. As an example, a surfactant can be amphiphilic with hydrophobic character and hydrophilic character where the surfactant can orient itself at the interface between a hydrophobic liquid and a hydrophilic liquid, where "hydrophilic" and "hydrophobic" can be relative terms with respect to the two liquids. As an example, consider water and oil where a portion of a surfactant that is hydrophilic associates with a portion of the water and where a portion of the surfactant that is hydrophobic associates with a portion of the oil. Where a gas phase is present such as air, hydrocarbon gas, etc., a portion of a surfactant may associate with the gas phase while, for example, another portion associates with a liquid phase.

A surfactant can be defined as a chemical that preferentially adsorbs at an interface, lowering the surface tension or interfacial tension between fluids or between a fluid and a solid. The term "surfactant" can encompass a multitude of materials that function as emulsifiers, dispersants, oil-wetters, water-wetters, foamers and defoamers. The type of surfactant behavior depends on structural groups of a molecule (e.g., or mixture of molecules). As an example, a hydrophile-lipophile balance (HLB) number can help to define the function that a molecular group will perform.

A HLB number can be on a scale of one to 40 according to the HLB system devised by Griffin. The HLB system is a semi-empirical method to predict what type of surfactant properties a molecular structure will provide. The HLB system is based on the concept that some molecules have hydrophilic groups, other molecules have lipophilic groups, and some have both. Weight percentage of each type of group on a molecule or in a mixture can help to predict what behavior the molecular structure will exhibit. Water-in-oil emulsifiers tend to have a low HLB numbers (e.g., around 4); solubilizing agents tend to have high HLB numbers; and oil-in-water emulsifiers tend to have intermediate to high HLB numbers.

An emulsion can be a dispersion of one immiscible liquid into another, which may be achieved, for example, through the use of one or more types of chemical agents. For example, a surfactant may be utilized to reduce the interfacial tension between two liquids to achieve some amount of stability (e.g., depending on factors such as temperature, pressure, flow, pH, etc.). With respect to oil and water, an oil-in-water (or direct) emulsion or a water-in-oil (or invert) emulsion may exist.

Emulsions may form when fluid filtrates or injected fluids and reservoir fluids (for example oil or brine) mix or, for example, when the pH of a producing fluid changes, such as after an acidizing treatment. Acidizing might change the pH from 6 or 7 to less than 4. Emulsions may be found in gravel packs and perforations, or inside a formation (e.g., a reservoir formation, etc.). Some types of emulsions break when a source of mixing energy is reduced. Some natural and artificial stabilizing agents, such as surfactants and small particle solids, may tend to keep fluids emulsified. Natural surfactants, created by bacteria or during the oil generation process, can be found in various waters and crude oils, while artificial surfactants can be part of one or more drilling, completion and/or stimulation fluids. As to solids that can help to stabilize emulsions, consider one or more of iron sulfide, paraffin, sand, silt, clay, asphalt, scale and corrosion products.

As mentioned, surfactants may be utilized as part of a chemical EOR operation, for example, by injecting chemical agents into a formation. One particular approach, surfactant flooding, achieves this by reducing the interfacial tension (IFT) between oil and water and mobilizing trapped oil on microscopic scale. As an example, surfactants utilized as part of a chemical EOR operation may include one or more petroleum sulfonates, one or more ethoxylated alcohol sulfates, etc.

As mentioned, surfactants may be classified as amphiphilic molecules that include hydrophobic and hydrophilic groups. This amphiphilic nature can reduce the IFT between oil and water and, depending on circumstances, may lead to formation of aggregates called micelles and a separate microemulsion (ME) phase, for example, consider a separate ME phase that includes oil or water or both. Therefore, mutual solubility of immiscible fluids can be achieved, as well as enhanced flow characteristics of the water-oil-microemulsion system (as IFT between water/oil and newly formed ME phase can be reduced).

The process of adding surfactant to a mixture of oil and water can result in complex phase state changes. Such complex phase behavior, along with the rapid reduction of IFT, can make dynamic reservoir characterization via a dynamic reservoir simulator more challenging. A dynamic reservoir simulator can utilize one or more types of models that describe physical phenomena. For example, consider the Arrhenius equation as a model that characterizes dynamic reactions with respect to temperature.

The Arrhenius equation can be utilized to determine a rate of a chemical reaction and, for example, to calculate an energy of activation. The Arrhenius equation may have some physical justification while some contend that it is a type of empirical relationship, which is supported by real-world data. As an example, the Arrhenius equation can be used to model the temperature variation of diffusion coefficients, population of crystal vacancies, creep rates, and various other thermally-induced processes/reactions.

As to mixtures of liquids that include oil and an aqueous medium, an increase in temperature can enhance the thermal energy of the mixture that may, for example, cause an oil droplet to vibrate and travel faster in Brownian motion within an aqueous medium, thus easier for an emulsion to flow. Based on the Arrhenius equation, there is an inverse relationship between the viscosity and the temperature:

$$\eta = \eta_o \exp(E_a RT)$$

where $\eta_o$ is a constant, E a is the activation energy, T is the absolute temperature, and R is the gas constant (8.314 KJ mol$^{-1}$). Viscosities of formulations may decrease with an increase in temperature within a mixture that can be adequately described by the Arrhenius equation; noting that factors related to loose packing between polymer chains can cause more space for a polymer chain to slip through.

As an example, an emulsion may be a micro-emulsion or microemulsion (ME), which can be a dispersion made of water, oil (e.g., a water insoluble liquid), and surfactant(s) that is an isotropic and thermodynamically stable system with dispersed domain diameter varying approximately from 1 nm to 100 nm (e.g., consider a range from approximately 10 nm to approximately 50 nm). Such a definition may be an IUPAC definition. In a microemulsion the domains of the dispersed phase can be globular or interconnected (e.g., consider a bicontinuous microemulsion). As an example, an emulsion may be a macro-emulsion or macroemulsion where the average diameter of droplets in a macroemulsion can be close to one millimeter. As an example, a microemulsion can be a mixture where entities of a dispersed phase are stabilized by a surfactant and/or a surfactant-cosurfactant system (e.g., aliphatic alcohol, etc.).

A dynamic reservoir simulator that can characterize dynamic behavior of a reservoir, particularly where chemical EOR is utilized, can facilitate operational decision making as to various factors of development of a field. For example, output from a dynamical reservoir simulator can be utilized to determine amounts and/or types of chemical(s) to utilize for chemical EOR, when to and/or not to utilize one or more chemical(s) for chemical EOR, injection rate(s) of chemical(s), etc. As an example, decisions as to types of equipment, types of drilling, types of hydraulic fracturing, etc. may be based at least in part on output from a dynamic reservoir simulator that can characterize dynamic behavior of a reservoir based at least in part on data (e.g., survey data) and one or more models (e.g., that model physical phenomena, etc.).

As an example, simulator can include features of the UTCHEM simulator, which is a multicomponent, multiphase, three-dimensional chemical compositional reservoir simulation model simulator. In the UTCHEM simulator, flow and transport equations are as follows: a mass conservation equation for each chemical species; an overall mass conservation equation that yields a pressure equation when combined with a generalized Darcy's law; and an energy conservation equation. In the UTCHEM simulator, four phases can be modeled. The phases are a single component gas phase and up to three liquid phases—aqueous, oleic, and microemulsion—depending on the relative amounts and effective electrolyte concentration (salinity) of the surfactant/oil/water phase environment. In the UTCHEM simulator, accurate and realistic chemical flooding models the complex microemulsion phase behavior and the various properties associated with these phases (such as interfacial tension, relative permeability, capillary pressure, capillary desaturation and viscosity) and factors that determine the behavior of the species in these phases such as dispersion, adsorption and cation exchange. The resulting flow equations of the UTCHEM simulator are solved using a block-centered finite-difference scheme. The solution method is implicit in pressure and explicit in concentration (IMPES-like). A third-order spatial discretization is used and in order to increase the stability and robustness of the third-order method, a flux limiter based on the total-variation-diminishing scheme has been added. The UTCHEM simulator can be used to simulate laboratory and field scale processes such as water flooding, tracers in water, polymer, surfactant/polymer, profile control using gel, and high pH alkaline/surfactant/polymer. Some applications of a simulator such as the UTCHEM simulator include: surfactant flooding, high pH alkaline/surfactant/polymer flooding, polymer flooding, conformance control using polymer gels, tracer tests, formation damage, soil remediation, microbial enhanced oil recovery and surfactant/foam.

As an example, various features of the UTCHEM simulator may be utilized in the INTERSECT® simulator (Schlumberger Limited, Houston, Tex.). The INTERSECT® simulator (e.g., INTERSECT (IX)) can characterize dynamic reservoir behavior where there is a presence of a microemulsion phase, which may be present for one or more periods of time.

The INTERSECT® high-resolution reservoir simulator can provide for accuracy and efficiency in field development planning and risk mitigation. As an example, the INTERSECT® simulator may be utilized to characterize a reservoir as to one or more of the following: complex geological structures, highly heterogeneous formations, challenging wells and completion configurations, advanced production controls in terms of reservoir coupling and flexible field management.

A simulator such as the INTERSECT® simulator may be utilized to achieve gains in consistency and productivity, for example, through automation and/or cross-discipline integration. For example, one or more projects may be undertaken using the INTERSECT® simulator together with the PETREL® E&P software platform (Schlumberger Limited, Houston, Tex.). A system can provide an ability to define the structure and properties of a reservoir (e.g., using survey data, etc.), characterize fluids and rock physics, and output and implement a field development plan.

As an example, a method can include performing one or more integrated workflows through a framework such as the PETREL® E&P platform or framework. The PETREL® E&P software platform can integrate multidisciplinary workflows as associated with the INTERSECT® simulator, which can provide data flows and graphical user interfaces for reservoir engineering. The PETREL® platform supports automated, repeatable workflows that streamline the incorporation of new data in a manner that can help to keep a modeled subsurface (e.g., dynamic reservoir) live and current. Migrator functionality of the INTERSECT® simulator can allow reservoir engineers to move from the ECLIPSE® reservoir simulator to the INTERSECT® simulator, with data validation performed by both the migrator and INTERSECT® simulator to help ensure the quality of a reservoir model. The INTERSECT® simulator can deliver insights through reservoir characterization. As an example, a simulator (e.g., and/or a framework) may be implemented in one or more manners (e.g., workstation, laptop, in-house cluster, service in the cloud, etc.).

Below, various examples of equipment, frameworks, simulators, etc. are described, which may be utilized to implement one or more techniques for reservoir characterization. Such examples may be utilized, for example, to characterize one or more formations subject to EOR (e.g., surfactant flooding, etc.). As an example, an operation can include surfactant flooding. Such an enhanced oil recovery (EOR) process can include adding an amount of surfactant (s) to an aqueous fluid injected into a reservoir, for example, in a manner that aims to sweep the reservoir. In such a chemical EOR, the presence of surfactant aims to reduce the interfacial tension (IFT) between the oil and water phases and can, for example, alter wettability of reservoir rock in a manner that can improve oil recovery.

As to permeability for characterizing a reservoir via reservoir simulation (e.g., via a reservoir simulator), data can be in a tabulated form (e.g., discrete data points, etc.) that may represent a function of phase relative permeability versus phase saturation (e.g., or a "curve" of phase relative permeability versus phase saturation). Of such function data, so-called end-points may be defined. For example, consider the following end-points: (i) connate saturation, the saturation below which a phase does not fall; (ii) critical saturation, the highest saturation for which a relative permeability of a phase is zero (e.g., at a saturation value above the critical saturation value, a phase may be deemed to be mobile); and (iii) maximum saturation, the saturation above which a phase does not exceed. As an example, saturation functions may be specified to honor certain conditions between phases, which may arise, for example, due to mass conservation (e.g., mass balance), as phase saturations of multiple fluids that may be constrained to sum to unity (e.g., approximately unity within an error limit or error limits).

As an example, a subsurface environment may be understood via data acquisition and analysis. As an example, seismology may be used to acquire data. In such an example, the data may be subject to interpretation. For example, consider seismic interpretation as a process that involves examining seismic data (e.g., with respect to location and time or depth) to identify one or more types of subsurface structures (e.g., facies, horizons, faults, geobodies, etc.). Seismic data may optionally be interpreted with other data such as, for example, well log data. As an example, a process may include receiving data and generating a model based at least in part on such data.

As an example, a process may include determining one or more seismic attributes. A seismic attribute may be considered, for example, a way to describe, quantify, etc., characteristic content of seismic data. As an example, a quantified characteristic may be computed, measured, etc., from seismic data. As an example, a framework may include processor-executable instructions stored in memory to determine one or more seismic attributes. Seismic attributes may optionally be classified, for example, as volume attributes or surface attributes or one-dimensional attributes.

A seismic interpretation may be performed using displayable information, for example, by rendering information to a display device, a projection device, a printing device, etc. As an example, one or more color schemes (e.g., optionally including black and white or greyscale) may be referenced for displayable information to enhance visual examination of the displayable information. Where the human eye will be used or is used for viewing displayable information, a display scheme may be selected to enhance interpretation.

As an example, seismic interpretation may be performed using seismic to simulation software such as the PETREL® seismic to simulation software framework (Schlumberger Limited, Houston, Tex.), which includes various features to perform attribute analyses (e.g., with respect to a 3D seismic cube, a 2D seismic line, etc.). While the PETREL® seismic to simulation software framework is mentioned, other types of software, frameworks, etc., may be employed. As an example, a model built using a framework may be utilized by a simulator, for example, consider a reservoir simulator such as the ECLIPSE® simulator (Schlumberger Limited, Houston, Tex.), the INTERSECT® simulator (Schlumberger Limited, Houston, Tex.), etc.

As an example, "pay" may be a reservoir or portion of a reservoir that includes economically producible hydrocarbons (e.g., pay sand, pay zone, etc.). The overall interval in which pay sections occur may be referred to as gross pay; where, for example, smaller portions of the gross pay that meet local criteria for pay (e.g., such as minimum porosity, permeability and hydrocarbon saturation) are referred to as net pay. As an example, a reservoir simulator may assess a geologic environment that includes at least a portion of a reservoir (e.g., or reservoirs) as to its physical properties that may be used to estimate pay. In such an example, parameters as to physical properties such as porosity, permeability and saturation may be included within equations that can model a geologic environment. As an example, such properties may be initialized prior to performing a simulation. In such an example, values for the properties may affect simulation results, convergence of a simulation solution, etc. As an example, a method can include adjusting values prior to performing a simulation, which may, in turn, reduce computation time, enhance convergence rate, allow for output of a converged solution, etc.

FIG. 1 shows an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. An example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE® reservoir simulator, the INTERSECT® reservoir simulator, etc. As an example, a simulation component, a simulator, etc. may optionally include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a framework such as the PETREL® seismic to simulation software framework. The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a framework environment such as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include one or more features of the OCEAN® framework where the model simulation layer 180 may include one or more features of the PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh. As an example, a mesh may be a grid. Such constructs (e.g., meshes or grids) may be defined by nodes, cells, intervals, segments, etc. As mentioned, a so-called meshless approach may be implemented, for example, based on points such as in a point cloud, etc.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, sets of instructions, etc.).

As an example, a framework may be implemented within or in a manner operatively coupled to the DELFI® cognitive E&P environment (Schlumberger Limited, Houston, Tex.), which is a secure, cognitive, cloud-based collaborative environment that integrates data and workflows with digital technologies, such as artificial intelligence and machine learning. As an example, the PETREL® framework may be utilized in conjunction with the DELFT® environment. As an example, one or more methods may be implemented at least in part via a framework (e.g., a computational framework) and/or an environment (e.g., a computational environment).

FIG. 2 shows an example of a sedimentary basin 210 (e.g., a geologic environment), an example of a method 220 for model building (e.g., for a simulator, etc.), an example of a formation 230, an example of a borehole 235 in a formation, an example of a convention 240 and an example of a system 250.

As an example, reservoir simulation, petroleum systems modeling, etc. may be applied to characterize various types of subsurface environments, including environments such as those of FIG. 1.

In FIG. 2, the sedimentary basin 210, which is a geologic environment, includes horizons, faults, one or more geobodies and facies formed over some period of geologic time. These features are distributed in two or three dimensions in space, for example, with respect to a Cartesian coordinate system (e.g., x, y and z) or other coordinate system (e.g., cylindrical, spherical, etc.). As shown, the model building method 220 includes a data acquisition block 224 and a model geometry block 228. Some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Furthermore, data may include depth and thickness maps stemming from facies variations (e.g., due to seismic unconformities) assumed to following geological events ("iso" times) and data may include lateral facies variations (e.g., due to lateral variation in sedimentation characteristics).

To proceed to modeling of geological processes, data may be provided, for example, data such as geochemical data (e.g., temperature, kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling, quantities such as temperature, pressure and porosity distributions within the sediments may be modeled, for example, by solving partial differential equations (PDEs) using one or more numerical techniques. Modeling may also model geometry with respect to time, for example, to account for changes stemming from geological events (e.g., deposition of material, erosion of material, shifting of material, etc.).

A modeling framework such as the PETROMOD® framework (Schlumberger Limited, Houston, Tex.) can include features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As shown in FIG. 2, the formation 230 includes a horizontal surface and various subsurface layers. As an example, a borehole may be vertical. As another example, a borehole may be deviated. In the example of FIG. 2, the borehole 235 may be considered a vertical borehole, for example, where the z-axis extends downwardly normal to the horizontal surface of the formation 230. As an example, a tool 237 may be positioned in a borehole, for example, to acquire information. As mentioned, a borehole tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

As an example, a borehole may be vertical, deviate and/or horizontal. As an example, a tool may be positioned to acquire information in a horizontal portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the TECHLOG® framework (Schlumberger Limited, Houston, Tex.).

As to the convention 240 for dip, as shown, the three dimensional orientation of a plane can be defined by its dip and strike. Dip is the angle of slope of a plane from a horizontal plane (e.g., an imaginary plane) measured in a vertical plane in a specific direction. Dip may be defined by magnitude (e.g., also known as angle or amount) and azimuth (e.g., also known as direction). As shown in the convention 240 of FIG. 2, various angles φ indicate angle of slope downwards, for example, from an imaginary horizontal plane (e.g., flat upper surface); whereas, dip refers to the direction towards which a dipping plane slopes (e.g., which may be given with respect to degrees, compass directions, etc.). Another feature shown in the convention of FIG. 2 is strike, which is the orientation of the line created by the intersection of a dipping plane and a horizontal plane (e.g., consider the flat upper surface as being an imaginary horizontal plane).

Some additional terms related to dip and strike may apply to an analysis, for example, depending on circumstances, orientation of collected data, etc. One term is "true dip" (see, e.g., $Dip_T$ in the convention 240 of FIG. 2). True dip is the dip of a plane measured directly perpendicular to strike (see, e.g., line directed northwardly and labeled "strike" and angle $\alpha_{90}$) and also the maximum possible value of dip magnitude. Another term is "apparent dip" (see, e.g., $Dip_A$ in the convention 240 of FIG. 2). Apparent dip may be the dip of a plane as measured in any other direction except in the direction of true dip (see, e.g., $\phi_A$ as $Dip_A$ for angle α); however, it is possible that the apparent dip is equal to the true dip (see, e.g., φ as $Dip_A=Dip_T$ for angle $\alpha_{90}$ with respect to the strike). In other words, where the term apparent dip is used (e.g., in a method, analysis, algorithm, etc.), for a particular dipping plane, a value for "apparent dip" may be equivalent to the true dip of that particular dipping plane.

As shown in the convention 240 of FIG. 2, the dip of a plane as seen in a cross-section perpendicular to the strike is true dip (see, e.g., the surface with φ as $Dip_A=Dip_T$ for angle $\alpha_{90}$ with respect to the strike). As indicated, dip observed in a cross-section in any other direction is apparent dip (see, e.g., surfaces labeled $Dip_A$). Further, as shown in the convention 240 of FIG. 2, apparent dip may be approximately 0 degrees (e.g., parallel to a horizontal surface where an edge of a cutting plane runs along a strike direction).

In terms of observing dip in wellbores, true dip is observed in wells drilled vertically. In wells drilled in any other orientation (or deviation), the dips observed are apparent dips (e.g., which are referred to by some as relative dips). In order to determine true dip values for planes observed in such boreholes, as an example, a vector computation (e.g., based on the borehole deviation) may be applied to one or more apparent dip values.

As mentioned, another term that finds use in sedimentological interpretations from borehole images is "relative dip" (e.g., $Dip_R$). A value of true dip measured from borehole images in rocks deposited in very calm environments may be subtracted (e.g., using vector-subtraction) from dips in a sand body. In such an example, the resulting dips are called relative dips and may find use in interpreting sand body orientation.

A convention such as the convention 240 may be used with respect to an analysis, an interpretation, an attribute, etc. (see, e.g., various blocks of the system 100 of FIG. 1). As an example, various types of features may be described, in part, by dip (e.g., sedimentary bedding, faults and fractures, cuestas, igneous dikes and sills, metamorphic foliation, etc.). As an example, dip may change spatially as a layer approaches a geobody. For example, consider a salt body that may rise due to various forces (e.g., buoyancy, etc.). In such an example, dip may trend upward as a salt body moves upward.

Seismic interpretation may aim to identify and/or classify one or more subsurface boundaries based at least in part on one or more dip parameters (e.g., angle or magnitude, azimuth, etc.). As an example, various types of features (e.g., sedimentary bedding, faults and fractures, cuestas, igneous dikes and sills, metamorphic foliation, etc.) may be described at least in part by angle, at least in part by azimuth, etc.

As an example, equations may be provided for petroleum expulsion and migration, which may be modeled and simulated, for example, with respect to a period of time. Petroleum migration from a source material (e.g., primary migration or expulsion) may include use of a saturation model where migration-saturation values control expulsion. Determinations as to secondary migration of petroleum (e.g., oil or gas), may include using hydrodynamic potential of fluid and accounting for driving forces that promote fluid flow. Such forces can include buoyancy gradient, pore pressure gradient, and capillary pressure gradient.

As shown in FIG. 2, the system 250 includes one or more information storage devices 252, one or more computers 254, one or more networks 260 and one or more sets of instructions 270. As to the one or more computers 254, each computer may include one or more processors (e.g., or processing cores) 256 and memory 258 for storing instructions (e.g., one or more sets of instructions 270), for example, executable by at least one of the one or more processors. As an example, a computer may include one or more network interfaces (e.g., wired or wireless), one or more graphics cards, a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 252.

As an example, the one or more sets of instructions 270 may include instructions (e.g., stored in memory) executable by one or more processors to instruct the system 250 to perform various actions. As an example, the system 250 may be configured such that the one or more sets of instructions 270 provide for establishing the framework 170 of FIG. 1 or a portion thereof. As an example, one or more methods, techniques, etc. may be performed using one or more sets of instructions, which may be, for example, one or more of the one or more sets of instructions 270 of FIG. 2.

As an example, "pay" may be a reservoir or portion of a reservoir that includes economically producible hydrocarbons (e.g., pay sand, pay zone, etc.). The overall interval in which pay sections occur may be referred to as the gross pay; where, for example, smaller portions of the gross pay that meet local criteria for pay (e.g., such as minimum porosity, permeability and hydrocarbon saturation) are net pay. Thus, a workflow may include assessing a geologic environment that includes at least a portion of a reservoir (e.g., or reservoirs) as to its physical properties that may be used to estimate pay. For example, an assessment may include acquiring data, estimating values, etc. and running a simulation using a reservoir simulator. In such an example, parameters as to physical properties such as porosity, permeability and saturation may be included within equations that can model a geologic environment.

As an example, porosity may be defined as the percentage of pore volume or void space, or that volume within rock that can include fluid(s). Porosity may be a relic of deposition (e.g., primary porosity, such as space between grains that were not compacted together completely) or it may develop through alteration of the rock (e.g., secondary porosity, such as when feldspar grains or fossils are dissolved from sandstones). Porosity may be generated by development of fractures (e.g., consider fracture porosity). Effective porosity may be defined as the interconnected pore volume in rock that can contribute to fluid flow in a reservoir (e.g., excluding isolated pores). Total porosity may be defined as the total void space in rock whether or not it can contribute to fluid flow (e.g., consider effective porosity being less than total porosity). As an example, a shale gas reservoir may tend to have relatively high porosity, however, alignment of platy grains such as clays can make for low permeability.

As an example, permeability may be defined as an ability, or measurement of rock ability, to transmit fluids, which may be measured in units such as darcies, millidarcies, etc. Formations that transmit fluids readily (e.g., sandstones) may be characterized as being "permeable" and may tend to include connected pores; whereas, "impermeable" formations (e.g., shales and siltstones) may tend to be finer grained or of a mixed grain size, with smaller, fewer, or less interconnected pores.

Absolute permeability is the measurement of the permeability conducted when a single fluid, or phase, is present in a matrix (e.g., in rock). Effective permeability is the ability to preferentially flow or transmit a particular fluid through a rock when other immiscible fluids are present in the reservoir (e.g., effective permeability of gas in a gas-water reservoir). The relative saturations of fluids as well as the nature of a reservoir can affect effective permeability. As an example, saturation may be defined for a water, oil and gas as the relative amount of the water, the oil and the gas in pores of rock, for example, as a percentage of volume.

Relative permeability may be defined as the ratio of effective permeability of a particular fluid at a particular saturation to absolute permeability of that fluid at total saturation. As an example, if a single fluid is present in rock, its relative permeability may be 1 (unity). Calculation of relative permeability can allow for comparison of different abilities of fluids to flow in the presence of each other, for example, as the presence of more than one fluid may tend to inhibit flow.

As an example, a method may include creating a simulation case, for example, using a framework (e.g., the OCEAN® framework). In such an example, a workflow may include initiating a simulation case, optionally using a tool such as a "wizard". As an example, a workflow can include defining arguments. For example, consider arguments that may be associated with a grid model of a geologic environment. In such an example, a grid model may be a pillar grid model or other type of grid model. Arguments associated with a grid model may include physical properties of rock such as, for example, porosity and permeability and may include functions that can define physical phenomena such as, for example, a saturation function, a rock compaction function, a black oil fluid function, etc.

As an example, a workflow may include accessing a reservoir simulator such as, for example, an ECLIPSE® reservoir simulator, an INTERSECT® reservoir simulator, etc. As an example, a workflow can include getting a grid from a grid porosity property and, for example, setting a case grid property argument (e.g., .Grid.Matrix.Porosity) to an input porosity property (e.g., as a "GridItem<Property>"). As an example, a workflow can include setting grid property arguments (e.g., "Grid.Matrix.Permeability" for indexes I, J and K of a grid) to appropriate input permeability properties (e.g., as a "GridItem<Property>"). As an example, a workflow can include setting one or more case function arguments. For example, consider a saturation function being set to an input function, a rock compaction function being set to an input function, a black oil function being set to an input function, etc.

As an example, a workflow may include a case argument for a simulation case such as an initialization argument (e.g., consider "InitializeByEquilibration").

As an example, a workflow can include receiving properties and functions. For example, consider accessing data for a project created with a framework such as the PETREL® framework. In such an example, data may be received for purposes of performing a simulation such as a reservoir simulation. For example, consider a Gullfaks project (e.g., for at least a portion of the Gullfaks field, an oil and gas field in the Norwegian sector of the North Sea) where properties such as permeability and porosity may be loaded, a sand saturation function (e.g., as a type of rock physics function) may be loaded, a consolidated sandstone rock compaction function may be loaded (e.g., as a type of rock physics function), where "light oil and gas" may be loaded as a black oil fluid input, etc. Given various properties and functions, a simulation may be run that may provide simulation results.

As an example, a grid may include grid cells where properties are defined with respect to a position or positions of a grid cell. For example, a property may be defined as being at a centroid of a grid cell. As an example, consider cell properties such as porosity (e.g., a PORO parameter), permeability in an x-direction (e.g., a PERMX parameter), permeability in a y-direction (e.g., a PERMY parameter), permeability in a z-direction (e.g., a PERMZ parameter) and net-to-gross ratio (e.g., NTG) being defined as averages for a cell at a center of a cell. In such an example, the directions x, y and z may correspond to directions of indexes (e.g., I, J and K) of a grid that may model a geologic environment.

As an example, a reservoir simulator may take as input values that may be predetermined. For example, to approximate multiphase flow effects through porous media, one or more tabulated saturation functions values may be used that characterize relative permeability of a phase given one or more saturations of one or more other phases. As an example, tabulated functions may be available on a facies dependent basis where values are available for individual facies. As an example, where a cell of a model (e.g., a grid cell) is associated with a particular facies, that cell may be assigned a value from a table (e.g., or other form for a predetermined value). In such an example, multiple cells may be assigned a common value. For a corresponding geologic environment, common values assigned to cells that model a region of the geologic environment may be an approximation of the geologic environment. In other words, values that differ for one or more of the cells may more accurately represent the region of the geologic environment.

Figure 3:
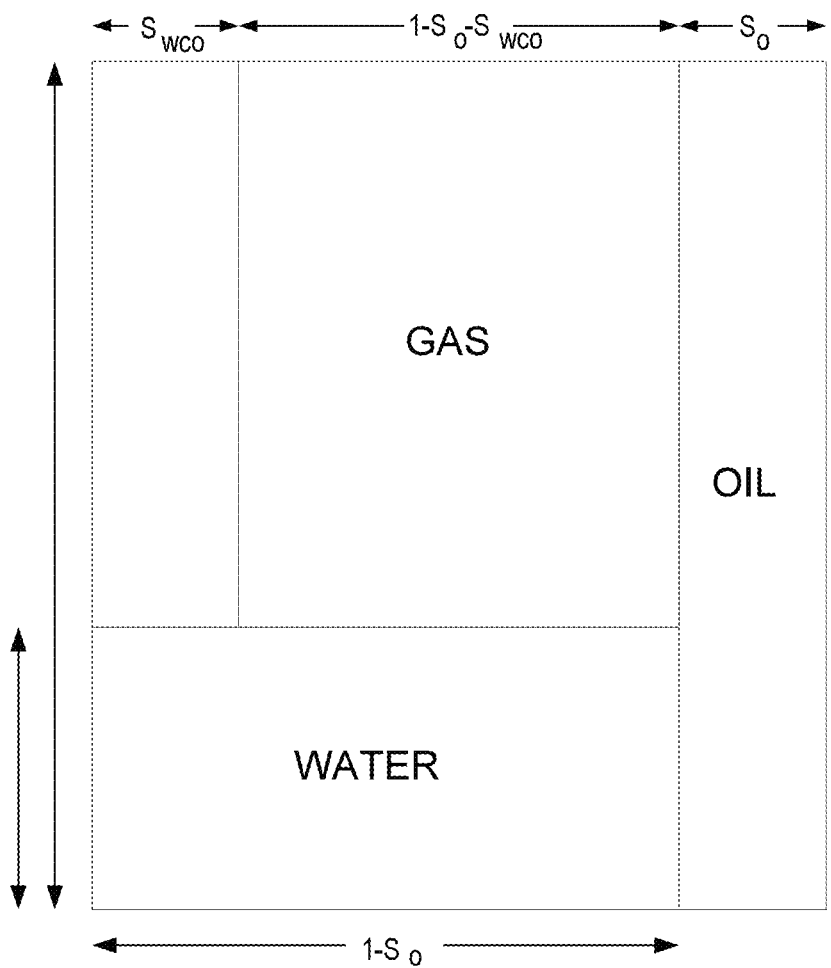
FIG. 3 illustrates examples of equations and an example of a plot.

FIG. 3 shows an example of a model for fraction of mobile gas 312 and a model for fraction of mobile water 314, an example of a multi-phase oil relative permeability mixing rule 316 and a plot 320 that illustrates portions of water, gas and oil phases with respect to saturations. As illustrated in FIG. 3, oil relative permeability depends on saturations.

As an example, in the context of a geologic environment that includes a reservoir to be developed or under development, a reservoir simulator may be used to assess the environment, optionally before drilling of one or more wells or other operations (e.g., fracturing, etc.). In such an example, a reservoir simulator may be implemented to advance in time (e.g., via time increments, etc.) given one or more wells where, for example, an individual well may be assigned to be a sink or a source. As an example, a well may be an injection well or a production well. Information such as that of the plot 320 of FIG. 3 may facilitate development, for example, to understand better where mobile oil may exist within a reservoir, to understand better where injection or other recovery techniques may be implemented to produce oil, etc.

FIG. 4 shows an example of a method 410 that includes a calculation block 420 for calculating pore volumes, transmissibilities, depths and NNCs, an initialization and calculation block 440 for initializing and calculating initial saturations, pressure and fluids in place, and a definition and time progression block 460 for defining one or more wells and surface facilities and advancing through time, for example, via material balances for individual cells (e.g., with the one or more wells as individual sinks and/or sources).

As to the initialization and calculation block 440, for an initial time (e.g., to), saturation distribution within a grid model of a geologic environment and pressure distribution within the grid model of the geologic environment may be set to represent an equilibrium state (e.g., a static state or "no-flow" state), for example, with respect to gravity. As an example, to approximate the equilibrium state, calculations can be performed. As an example, such calculations may be performed by one or more sets of instructions. For example, one or more of a seismic-to-simulation framework, a reservoir simulator, a specialized sets of instructions, etc. may be implemented to perform one or more calculations that may aim to approximate or to facilitate approximation of an equilibrium state. As an example, a reservoir simulator may include a set of instructions for initialization using data to compute capillary and fluid gradients, and hence fluid saturation densities in individual cells of a grid model that represents a geologic environment.

Initialization aims to define fluid saturations in individual cells such that a "system" being modeled is in an equilibrium state (e.g., where no external forces are applied, no fluid flow is to take place in a reservoir, a condition that may not be obeyed in practice). As an example, consider oil-water contact and assume no transition zone, for example, where water saturation is unity below an oil-water contact and at connate water saturation above the contact. In such an example, grid cells that include oil-water contact may pose some challenges. A cell (e.g., or grid cell) may represent a point or points in space for purposes of simulating a geologic environment. Where an individual cell represents a volume and where that individual cell includes, for example, a center point for definition of properties, within the volume of that individual cell, the properties may be constant (e.g., without variation within the volume). In such an example, that individual cell includes one value per property, for example, one value for water saturation. As an example, an initialization process can include selecting a value for individual properties of individual cells.

As an example, saturation distribution may be generated based on one or more types of information. For example, saturation distribution may be generated from seismic information and saturation versus depth measurements in one or more boreholes (e.g., test wells, wells, etc.). As an example, reproduction of such an initial saturation field via a simulation model may be inaccurate and such an initial saturation field may not represent an equilibrium state, for example, as a simulator model approximates real physical phenomena.

As an example, an initialization of water saturation may be performed using information as to oil-water contact. For example, for a cell that is below oil-water contact, a water saturation value for that cell may be set to unity (i.e., as water is the more dense phase, it is below the oil-water contact); and for a cell that is above oil-water contact, a water saturation value for that cell may be set to null (i.e., as oil is the lighter phase, it exists above water and hence is assumed to be free of water). Thus, in such an example, where at least some information as to spatially distributed depths of oil-water contact may be known, an initialized grid cell model may include cells with values of unity and cells with values of zero for water saturation.

As mentioned, an initialized grid cell model may not be in an equilibrium state. Thus, sets of instructions may be executed using a computing device, a computing system, etc. that acts to adjust an initialized grid cell model to approximate an equilibrium state. Given a certain saturation field for a grid cell model, a technique may adjust relative permeability end points (e.g., critical saturations) such that relevant fluids are just barely immobile at their calculated or otherwise defined initial saturations. As a result, the grid cell model, as initialized, may represent a quiescent state in the sense that no flow will occur if a simulation is started without application of some type of "force" (e.g., injection, production, etc.).

As mentioned, a reservoir simulator may advance in time. As an example, a numeric solver may be implemented that can generate a solution for individual time increments (e.g., points in time). As an example, a solver may implement an implicit solution scheme and/or an explicit solution scheme, noting that an implicit solution scheme may allow for larger time increments than an explicit scheme. Times at which a solution is desired may be set forth in a "schedule". For example, a schedule may include smaller time increments for an earlier period of time followed by larger time increments.

A solver may implement one or more techniques to help assure stability, convergence, accuracy, etc. For example, when advancing a solution in time, a solver may implement sub-increments of time, however, an increase in the number of time increments can increase computation time. As an example, an adjustable increment size may be used, for example, based on information of one or more previous increments.

As an example, a simulator may implement an adjustable grid (or mesh) approach to help with stability, convergence, accuracy, etc. For example, when advancing a solution in time, a solver may implement grid refinement in a region where behavior may be changing, where a change in conditions exists/occurs, etc. For example, where a spatial gradient of a variable exceeds a threshold spatial gradient value, a re-gridding may be implement that refines the grid in the region by making grid cells smaller.

Adaptive gridding can help to decrease computational times of a simulator. Such a simulator may account for one or more types of physical phenomena, which can include concentrations, reactions, micelle formations, phase changes, thermal effects (e.g., introduction of heat energy, heat generated via reactions, heat consumed via reactions, etc.), momentum effects, pressure effects, etc. As an example, physical phenomena can be coupled via a system of equations of a simulator. One or more types of physical phenomena may be a trigger for adaptive gridding.

As an example, a numeric solver may implement one or more of a finite difference approach, a finite element approach, a finite volume approach, etc. As an example, the ECLIPSE® reservoir simulator can implement central differences for spatial approximation and forward differences in time. As an example, a matrix that represents grid cells and associated equations may be sparse, diagonally banded and blocked as well as include off-diagonal entries.

As an example, a solver may implement an implicit pressure, explicit saturation (IMPES) scheme. Such a scheme may be considered to be an intermediate form of explicit and implicit techniques. In an IMPES scheme, saturations are updated explicitly while pressure is solved implicitly.

As to conservation of mass, saturation values (e.g., for water, gas and oil) in individual cells of a grid cell model may be specified to sum to unity, which may be considered a control criterion for mass conservation. In such an example, where the sum of saturations is not sufficiently close to unity, a process may be iterated until convergence is deemed satisfactory (e.g., according to one or more convergence criteria). As governing equations tend to be non-linear (e.g., compositional, black oil, etc.), a Newton-Raphson type of technique may be implemented, which includes determining derivatives, iterations, etc. For example, a solution may be found by iterating according to the Newton-Raphson scheme where such iterations may be referred to as non-linear iterations, Newton iterations or outer iterations. Where one or more error criteria are fulfilled, the solution procedure has converged, and a converged solution has been found. Thus, within a Newton iteration, a linear problem is solved by performing a number of linear iterations, which may be referred to as inner iterations.

As an example, a solution scheme may be represented by the following pseudo-algorithm:

```
// Pseudo-algorithm for Newton-Raphson for systems
initialize(v);
do {
    //Non-linear iterations
    formulate_non_linear_system(v);
    make_total_differential(v);
    do {
        // Linear iterations:
        update_linear_system_variables(v);
    }
    while((linear_system_has_not_converged(v));
    update_non_linear_system_after_linear_convergence(v);
}
while((non_linear_system_has_not_converged(v))
```

As an example, a solver may perform a number of inner iterations (e.g., linear) and a number of outer iterations (e.g., non-linear). As an example, a number of inner iterations may be of the order of about 10 to about 20 within an outer iteration while a number of outer iterations may be about ten or less for an individual time increment.

As an example, a method can include adjusting values before performing an iteration, which may be associated with a time increment. As an example, a method can include a reception block for receiving values, an adjustment block for optimizing a quadratic function subject to linear constraints for adjusting at least a portion of the values to provide adjusted values and a simulation block to perform a simulation using at least the portion of the adjusted values.

As mentioned, fluid saturation values can indicate how fluids may be distributed spatially in a grid model of a reservoir. For example, a simulation may be run that computes values for fluid saturation parameters (e.g., at least some of which are "unknown" parameters) as well as values for one or more other parameters (e.g., pressure, etc.).

As mentioned, a simulator may implement one or more types of adjustment techniques such as, for example, one or more of time step adjustment and grid adjustment, which may be performed dynamically. As an example, a simulator such as a reservoir simulator may implement one or more of such adjustment techniques.

As mentioned, a simulation may account for one or more thermal processes where, for example, there can be displacement of a thermal front (e.g., a combustion front, a steam chamber interface, etc.), around which most fluid flows takes place. As an example, a dynamic gridding approach may aim to keep a finer scale representation of a grid around the thermal front and a coarser scale representation of the grid at some distance from the front. Through use of the coarser scale representation of the grid, the number of equations/number of variables may be reduced, which can reduce matrix sizes, etc., of a simulator and thereby allow the simulator to operate more effectively.

As an example, a simulator can commence a simulation with an original or initial grid. As the simulator operates to generate simulation results, the simulator may re-amalgamate its grid cells, while keeping some regions (for example around wells) finely gridded. The simulator may identify a moving front through one or more large spatial gradients of one or more specific properties (e.g., temperatures, fluid saturations and compositions, etc.). In the front vicinity, the simulator may de-amalgamate the originally amalgamated cells, and later on re-amalgamate them once the front has passed through a spatial region (e.g., a region of a subterranean formation such as a reservoir formation). As an example, amalgamated cells may be assigned up-scaled properties, for example, upscaling being based upon one or more types of averaging techniques.

As to thermal simulation, a simulator may include one or more features of a simulator such as the STARS simulator (Computer Modelling Group Ltd (CMG)). As an example, simulations may involve combustion and/or SAGD simulations. As an example, a simulator may operate according to a metric such as CPU time. As an example, a quantitative measure of efficiency can be CPU time in relationship to accuracy.

As explained, reservoir flow simulation benefits from representing an underground environment accurately, particularly where one or more fronts may exist, which may vary spatially and change differently in space with respect to time. For example, a front may be a relatively planar front at a particular spatial scale in a region or, for example, a front may include fingers, curves, etc. As an example, a front's shape may change with respect to time, in terms of overall extent and geometrical shape (e.g., planar, curved, fingering, etc.). Such variations can pose challenges in dynamic gridding.

As mentioned, thermal processes can involve convective, diffusive and dispersive flows of fluids and energy, which may lead to the formation of fluid banks and fronts moving in the reservoir. Some of these fronts may represent interfaces between mobilized oil, which is hot and has had its viscosity reduced, and the more viscous oils which are as yet unaffected by heat energy. As an example, other fronts can occur between phases, such as where a leading edge of hot combustion gas moves into an uncontacted oil. Such interfaces may be thin when compared to a cell size of a grid (e.g., an original grid) used to model EOR processes in a simulator. As such, challenges exist in how to properly represent various types of fluid physics near interfaces. As mentioned, use of fine scale computational grid cells throughout a reservoir can be prohibitively expensive.

As an example, a simulator can implement adaptive grid refinement and coarsening in a compositional reservoir simulation. Such an approach can optionally target individual grid cells for refinement based on one or more forecasted compositional fronts, which may be calculated, for example, using streamlines and an analytical convection-dispersive transport equation. In such an approach, a quadtree decomposition may be implemented to determine an optimal spatial discretization across a portion of a simulation grid using dynamic and static reservoir properties.

As an example, a dynamic gridding simulator may provide for specifying one or more limits as to how a grid is dynamically handled. For example, a parameter can be for grid cell refinement size as a pre-determined input value. As an example, a dynamic gridding simulator may perform dynamic gridding using a compositional map from a previous time step to "predict" a refinement region. As may be appreciated, where "old" information is relied upon (e.g., a previous time step map), a solution may be suboptimal due to time-lagging refinement and lack of grid adaptability in heterogeneous reservoirs and/or fast-moving compositional fronts. As mentioned, an approach may utilize techniques such as streamline and particle trajectories to forecast a location of a front and adapt grid sizes in advance of that front (e.g., prior to a time step where the front enters that location).

As an example, a method can include tracking compositional variations by calculating fluxes for grid cells using a numerical solver (e.g., a finite-difference solver, etc.). In such an example, a tracing technique can allow for reduction of a 3-dimensional gridded region into a series of 1-dimensional streamlines, while the convection-dispersive equation can forecast future compositions, shape, and location of an injection front along each streamline trajectory.

As an example, a method can include implementing a decomposition technique such as, for example, a quadtree decomposition technique. In such an example, the decomposition technique can provide for analysis of homogeneity of dynamic and/or static properties (e.g., composition, pressure, permeability, facies, etc.) to determine if a volumetric region can be represented by a single gridblock or if that volumetric region can be more effectively represented by refined grid cells that aim to preserve spatial details. As mentioned, a method can implement dynamic grid adjustment where, for example, grid discretization is dynamic with respect to time and where refining is utilized for grid regions that demand high-resolution and/or where coarsening is utilized for grid region that exhibit low variation therein.

As an example, a method may simulate $CO_2$ injection where a model can reduced a total number of grid cells to model and simulate miscible injection by continuously creating adaptive grids that represent the advancement and shape of the injection front. As an example, a reduction in computational demands may be approximately 30 percent or more over a static fine grid (e.g., without compromising the representation of compositional mixing phenomena and production forecast).

As explained, EOR can involve injection of water, gas, solvent, surfactant, etc., into a reservoir to enhance oil recovery. Forecasting and control of operations can involve simulation, for example, use of numerical models that can accurately represent compositional phenomena. Complex phase behavior created by continuous changes in fluid composition may demand small spatial discretization of a reservoir model; whereas, use of large grid cells may result in substantial errors in the forecast of production rates and breakthrough times due to numerical dispersion and non-linearity of the flash equation.

Numerical dispersion errors occur as a numerical technique's (e.g., finite difference) approximations replace mass conservation derivatives in a compositional system, which can cause truncation errors that lead to saturation and composition dispersion. In addition, the non-linearity of the flash equation may have an impact when averaging compositions and pressures over several grid cells. As various types of compositional simulators assume thermodynamic equilibrium in each grid cell, grouping cells and re-normalizing compositions may result in a different overall phase behavior response.

The use of small grid blocks can reduce the impact of both numerical dispersion and non-linearity of flash calculations. However, the high computational demands of solving flash equilibrium equations in multicomponent systems tends to make the use of fine grid cells relatively impractical for modeling an average sized reservoir.

Adaptive mesh refinement and coarsening provides for efficiencies in discretizing a spatial domain. As an example, an approach can include generating local grid adaptations to represent dynamic features of a reservoir model, providing a fine grid description in areas where spatial truncation errors are too high using coarser cells, while reducing the total numbers of blocks in the model. In addition to such a refining process, a method can include coarsening grid cells (e.g., to remove unnecessary grid cells in regions where fine resolution is no longer demanded). Such an approach can be quite practical in gas injection operations where some regions exhibit drastic changes (e.g., injection front), thus demanding quite fine resolution while others may remain relatively constant (e.g., swept and unswept regions).

In adaptive gridding, a challenge can be to identify one or more features that may be utilized as a basis for triggering a refinement process and/or a coarsening process. Various types of IMPES models tend to present rigid schemes with limitations such as: a refinement region is estimated from a previous time step solution (e.g., neglecting movement of an injection front at an end of a time step); and a size of grid cell sub-division is defined based on a pre-determined input value. As mentioned, such an approach can lead to suboptimal application due to time-lagging results and lack of refinement flexibility.

An approach that utilizes an adaptive grid/mesh refinement and coarsening (AMRC) model for compositional simulation can help to address one or more of the foregoing issues, for example, consider an implicit-pressure, explicit-saturation, and explicit-composition (IMPESC) approach incorporating a dynamic a priori determination of a refinement region and systematic selection of a level of grid cell sub-division. However, as mentioned, such an approach can depend on using streamlines and an analytical convection-dispersive transport equation. For example, consider a method that depends on a tracing technique allows for reduction of a 3-dimensional gridded region into a series of 1-dimensional streamlines, while the convection-dispersive equation can forecast future compositions, shape, and location of an injection front along each streamline trajectory.

As an example, a method can include adjusting a grid using a model, which may be, for example, a machine model that is trained using simulation data, which can include simulation data from one or more prior simulations. In such an example, the machine model can be trained to generate a trained machine model that can make predictions as to where and how a grid is to be adjusted during a simulation of a simulator. For example, a machine model can be a neural network model that is trained on large sets of data for one or more prior simulation runs for a reservoir or reservoirs. In such an example, the trained machine model can be utilized to predict where and how a front will progress given appropriate input. In such an example, a grid can be dynamically adjusted, for example, in a "just-in-time" manner that is informed by more than the on-going simulation itself. For example, a method can utilize more than on a tracing technique that generates streamlines for an on-going simulation and forecasting via a physics-based convection-dispersive equation for future compositions, shape, and location of a front along each streamline trajectory.

As explained, simulating fluid flow in reservoirs, and in particular, propagation of different components, is part of a larger workflow that can characterize, select and/or control one or more of various types of increased/enhanced oil recovery (e.g., EOR, etc.).

As explained, to help ensure that a simulator operates properly during a simulation (e.g., with high precision, providing fast performance for timely decision making), etc., a simulator can include its own control scheme or control schemes as to time stepping and/or adaptive gridding. Achieving high precision and fast performance (e.g., lesser computational demands) can be challenging when analyzing large reservoir models, especially ones with complex geological structure and fluid heterogeneity.

As an example, a simulator can include a controller that can control how a simulation is performed in a manner that the simulation can concentrate on physically and practically relevant parts of hydrocarbon flow in a complex reservoir. In such an example, the controller can help to ensure that a front propagation simulation is carried out in an appropriate level of detail via an adaptive/dynamic gridding scheme that can call for grid cell refinement in a manner that is precise and in-time, where it can be beneficial to meeting accuracy and computational resource demands. Such a technique can allow for other parts of a reservoir to be appropriately upscaled without losing beneficial information (e.g. via coarsening).

As an example, a method can include using one or more discretization techniques, as appropriated depending on the type of physical phenomena and/or spatial region and/or time stepping (e.g., non-linear solver) that may be involved. For example, a method can implement a kD-tree discretization on the basis of predictions from one or more machine learning regression techniques, such as Boosted Decision Tree, Decision Forest, Neural Network, that are trained on relevant data. For example, consider relevant data such as rock and fluid properties, which may include permeabilities, porosities, agent concentration and pressure gradients.

As to a kD-tree (or k-d-tree, or kd-tree), it can be a binary tree in which a leaf node is a k-dimensional point. In such an example, each non-leaf node can be thought of as implicitly generating a splitting hyperplane that divides the space into two parts, known as half-spaces, which can be referred to, for example, left and right spaces or, for example, first side and second side spaces as defined by a hyperplane or other appropriate dividing structure. As an example, points to the left of a hyperplane can be represented by a left subtree of that node and points to the right of the hyperplane can be represented by the right subtree. As an example, a hyperplane direction may be chosen in the following way: each node in the tree is associated with one of the k-dimensions, with the hyperplane perpendicular to that dimension's axis. So, for example, if for a particular split the "x" axis is chosen, points in the subtree with a smaller "x" value than the node will appear in the left subtree and points with larger "x" value will be in the right subtree. In such a case, the hyperplane would be set by the x-value of the point, and its normal would be the unit x-axis.

As an example, consider a method where moving down a tree, there is a cycling through axes used to select one or more splitting planes. For example, in a 3-dimensional tree, the root can have an x-aligned plane, the root's children can both have y-aligned planes, the root's grandchildren can have z-aligned planes, the root's great-grandchildren can have x-aligned planes, the root's great-great-grandchildren can have y-aligned planes, and so on. In such an example, points may be inserted by selecting the median of the points being put into the subtree, with respect to their coordinates in the axis being used to create the splitting plane. Such an approach can lead to a balanced kD tree, in which each leaf node is approximately the same distance from the root; noting that unbalanced trees may be utilized, depending on circumstances, etc.

As an example, additionally or alternatively to points, a kD-tree can include contain rectangles or hyper-rectangles. In such an approach, a range search can operate to return rectangles intersecting the search rectangle. Such a tree may be constructed with the rectangles at the leaves. In an orthogonal range search, the opposite coordinate may be used when comparing against the median.

As mentioned, one or more other techniques may be utilized, additionally or alternatively. A decision tree can be structural and represent a physical space such as a space of a subterranean environment. As to decision support, a tree-like model can provide for decision making as to where and how discretization of a spatial region is to occur, for example, with respect to one or more spatial phenomena that may be moving with respect to time (e.g., consider a moving front in a reservoir).

FIG. 5 shows an example of a method 500 of operating a reservoir simulator that includes a performance block 510 for performing a time step of a reservoir simulation using a spatial reservoir model that represents a subterranean environment that includes a reservoir to generate simulation results for a first time where the simulation results include a front defined by at least in part by a gradient at a position between a first portion and a second portion of the spatial reservoir model; a prediction block 520 for predicting a position of the front for a subsequent time step for a corresponding second time using a trained machine model; a discretization block 530 for discretizing the spatial reservoir model locally at the predicted position of the front to generate a locally discretized version of the spatial reservoir model; and a performance block 540 for performing a time step of the reservoir simulation using the locally discretized version of the spatial reservoir model to generate simulation results for the second time. As shown, the method 500 can be looped where the block 540 may proceed to the block 520 where the time at the block 520 can be the second time incremented to a third time, etc.

In the example of FIG. 5, the method 500 can control a reservoir simulator such that one or more types of operational modes are implemented based at least in part on underlying physics as to fluids. Such control can be utilized to generate simulation results that can be utilized for controlling one or more pieces of field equipment for performing one or more EOR operations (see, e.g., the system 700 of FIG. 7). As an example, results of a reservoir simulator can be utilized to generate and render a graphical user interface (GUI) to a display where results are distributed spatially, for example, as in cells of a model of the reservoir being simulated by the reservoir simulator. As an example, an operator and/or a controller may utilized spatially distributed results that correspond to a time or time to issue one or more signals (e.g., commands, etc.) to one or more pieces of field equipment (see, e.g., the GUIs 610 and 630 of FIG. 6 and the system 700 of FIG. 7).

The method 500 is shown in FIG. 5 in association with various computer-readable media (CRM) blocks 511, 521, 531 and 541. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 500. As an example, a computer-readable medium (CRM) may be a computer-readable storage medium that is non-transitory and that is not a carrier wave. As an example, one or more of the block 511, 521, 531 and 541 may be in the form processor-executable instructions, for example, consider the one or more sets of instructions 270 of the system 250 of FIG. 2 (see also the system 700 of FIG. 7 and the computerized control equipment 780).

The method 500 of FIG. 5 may provide for dynamic grid refinement for adaptive front tracking in reservoir simulations, for example, using a kD-tree technique for discretization and one or more machine learning regression techniques for purposes of prediction (e.g., Boosted Decision Tree, Decision Forest, Neural Network)

The method 500 of FIG. 5 can be part of a simulator that can improve the simulator, for example, by increasing performance and accuracy of simulating various types of hydrocarbon recovery in heterogeneous and structurally complex reservoirs.

EOR can include injection of surfactant to a downhole region of the Earth using equipment such as, for example, one or more pumps. As an example, a surfactant can include a chemical that forms a surfactant in a subterranean environment, for example, due to one or more chemical interactions and/or reactions that may occur in a subterranean environment. As an example, a surfactant can be a polymer that becomes a surface active agent responsive to exposure to an alkaline environment. For example, EOR can include injection of polymer as a surfactant where the polymer becomes a surface active agent downhole in a downhole alkaline environment.

As an example, a simulation may involve a model that includes a number of cells (e.g., grid cells) that may exceed one million cells (e.g., consider a model with 100,000,000 cells) such a model may take considerable time and computational resources to output a solution that characterizes a reservoir. As such, a simulation can represent an amount of time and resources expended where a solution is desired to be accurate. Where a simulation can be of greater accuracy, confidence may be increased in a solution that characterizes a reservoir, particularly where decisions are to be made as to injection, production, equipment development, drilling, etc.

As an example, a method may be implemented to improve convergence of a simulator operating according to a spatial model. For example, the method 500 of FIG. 5 may increase the ability of a simulator to converge on a solution (simulation result) at one or more times. Such an improvement can result in a more accurate solution (or even a solution where previously a solution is not found) and do so in lesser computational time (e.g., lesser demand on computational resources).

As an example, a dynamic reservoir simulation can include modeling water injection as may be associated with surfactant flooding as a chemical EOR operation. Such an approach may involve one or more cells of a grid cell model of a reservoir transitioning into, for example, a three phase region of a ternary phase diagram. As an example, a salinity gradient may exist as part of a physical reality that can drive a transition. As explained, a reservoir simulator can be improved by inclusion of operational instructions for decision making as to physical phenomena that can occur in a reservoir being subjected to one or more EOR operations. For example, where a front or fronts exist, a simulator can include dynamic gridding where, for example, a region in advance of a front is dynamically gridded via grid refinement. In such an example, the nature of the front may be taken into account, for example, the types of phases that may exist at the region may be taken into account (e.g., where a more complex region is expected phase-wise, the gridding may be refined and/or a time-step decreased).

Figure 6:
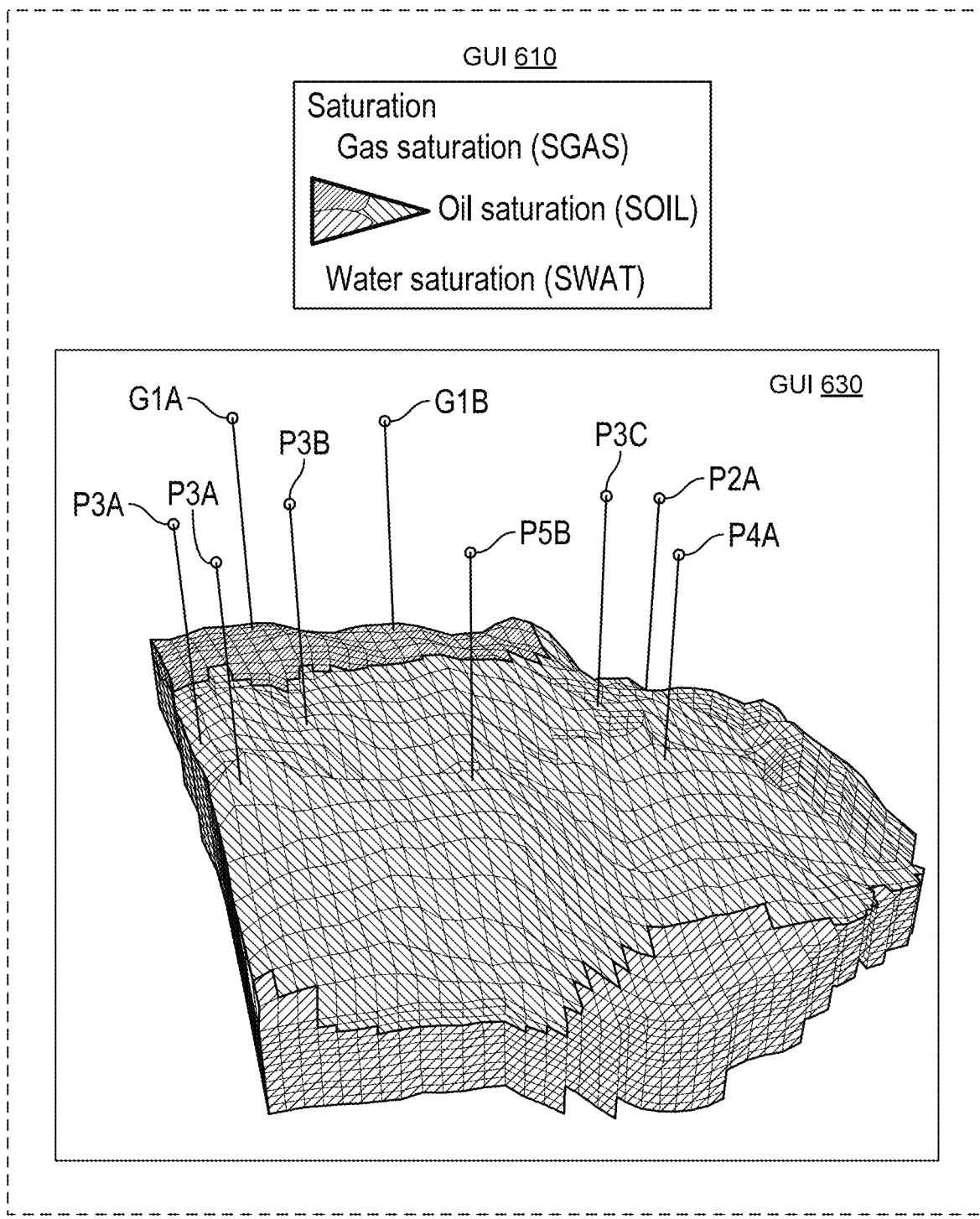
FIG. 6 illustrates examples of graphical user interfaces (GUIs)

FIG. 6 shows examples of graphical user interfaces (GUIs) 610 and 630. A graphical user interface (GUI) is a type of user interface that allows users to interact with electronic devices through various graphics and graphical controls, which can include graphical icons and visual indicators such as secondary notation. A GUI can be structured to perform operations of other types of physical input devices. For example, a GUI can include graphical controls for keys such as keys of a QWERTY keyboard. As such, a GUI is a physical device that allows for human-machine interactions. A typewriter can be built via components such as keys, ribbons, etc. As an example, a GUI can be built using hardware and software components. For example, specialized instructions executable by a processor (e.g., a CPU, GPU, core, microcontroller, etc.) can be executed to cause a rendering of graphics to a display. Such a display may be a touch-screen display with associated touch input circuitry (e.g., via a stylus, a finger, etc.). As an example, a computing system can include a human-machine input device such as a mouse, a touchpad, a trackball, a microphone (for voice input), etc. Such input devices may interact with the computing system to navigate a GUI and/or to select one or more features of the GUI, which may be selectively actuate for purposes of controlling the computing system.

In FIG. 6, the GUIs 610 and/or 630 can be rendered to show values or representations of values of a subterranean region of the Earth, which can include a reservoir. As an example, a GUI display can be operatively coupled to a simulator such that values (e.g., spatially distributed values) from the simulator can be utilized to generate visual representations of physical conditions of a field and/or physical phenomena of a field and/or operational control of field equipment. For example, in the GUI 630, various wells are labeled where the GUI 630 shows conditions at the wells. Such conditions can include saturations, relative permeabilities, flow rates, fluid compositions, microemulsions, etc. As shown, examples of gas saturation, oil saturation and water saturation are shown. Sub-regions are shown in the GUI 630 with respect to a grid model of the subterranean region. Such sub-regions correspond to saturations, per values from a simulator.

As an example, a controller can be instructed to control one or more field operations based on saturations, which may be matched to real-time for operations in the field. In such an example, a controller can instruct a pump to adjust a pump flow rate of fluid, which may include one or more chemicals, in a manner to alter saturations in the subterranean region. A controller can issue an instruction to a pump at a wellsite of one of the wells labeled in the GUI 630 to thereby cause the pump to adjust its flow rate of fluid, which can include one or more chemicals. The simulator may be updated responsive to such an adjustment, automatically and/or via user input. In such a workflow, the simulator can determine values for a past, present and/or future time. In such an example, one or more values may be utilized to revise the GUI 630 and/or to issue one or more additional control instructions.

As an example, a controller may issue one or more instructions based on the location of a front or fronts. In such an example, a controller can be a field controller that is operatively coupled to a simulator such that data generated by the simulator that represents actual physical conditions in a region of the earth are received and processed by the controller to make one or more control decisions, issue one or more instructions, etc. As an example, where a simulator includes a dynamic grid controller that makes predictions as to where a front is to be within a region represented by the grid, that data may be received by a field controller. For example, a field controller may operate based on output from a simulator's controller that is not yet fully informed by a simulation at a next time step. In such an example, the output may be given a confidence level as it may not be actual simulator results for the next time step. Where the simulator generates the actual simulator results for the next time step, those results may be received by the field generator, for example, with a higher confidence level. Such an approach may be referred to as a multi-tiered approach as a first tier can be based on a dynamic grid controller of the simulator and the second tier can be based on results output by the simulator (e.g., simulator or simulation results).

Figure 7:
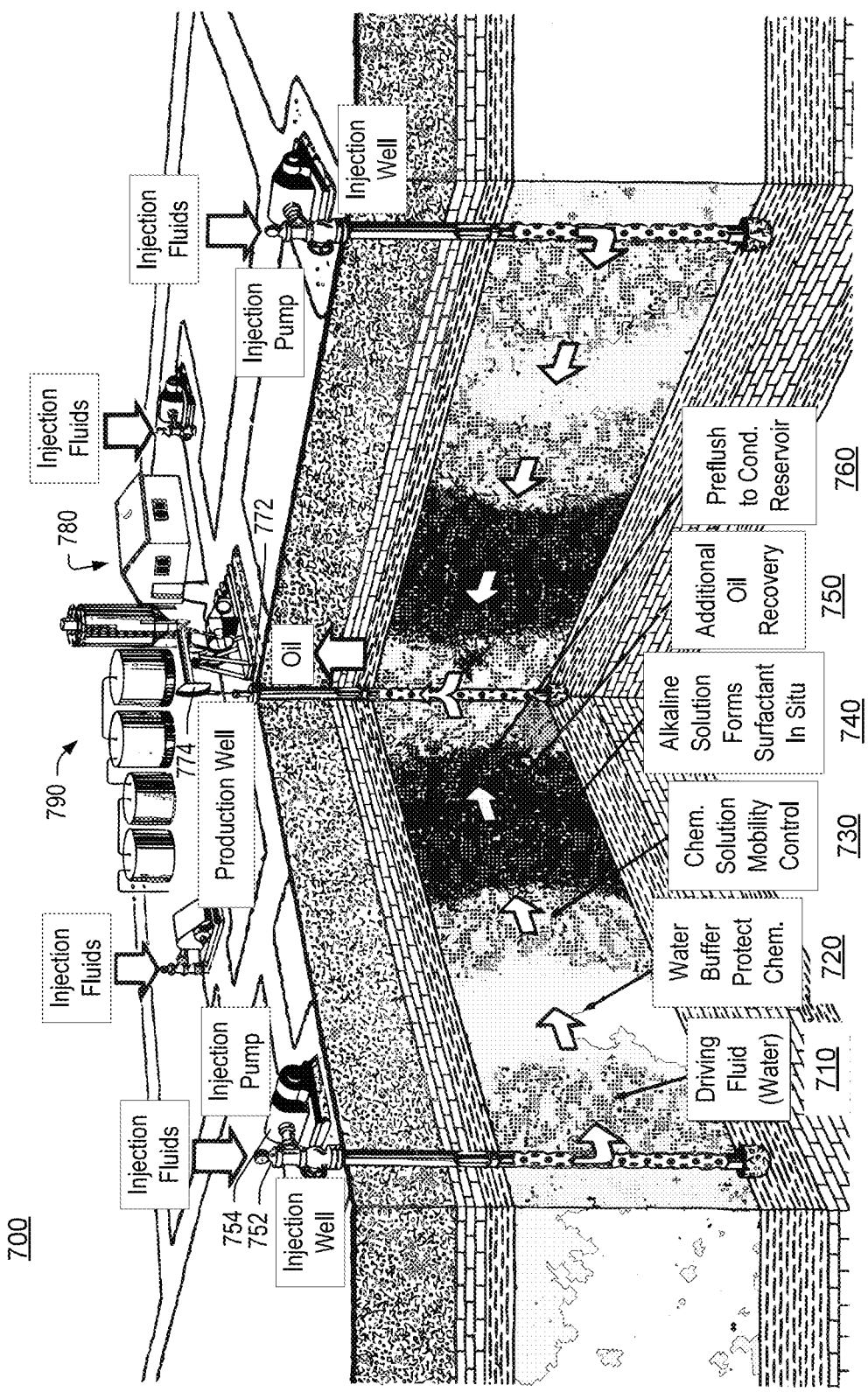
FIG. 7 illustrates an example of an operation and equipment.

FIG. 7 shows an example of a system 700 that includes various types of equipment for performing various types of field operations. The system 700 may be operatively coupled to a computing system that includes a simulator and that includes a display or displays that can render one or more GUIs such as, for example, one or more of the GUIs 610 and 630 of FIG. 6. As an example, the system 700 may be controllable and controlled by such a computing system, optionally via various GUI inputs.

In the system 700, various pieces of equipment are shown, which can include electronic equipment such as sensors, actuators, controllers, transmitters, receivers, etc. As an example, a computing system can be operatively coupled to one or more pieces of equipment via wire and/or wireless communication circuitry. As an example, a computing system can include a simulator as a specially programmed computerized framework that can calculate various values for purposes of controlling one or more pieces of field equipment. For example, a simulator can calculate a flow rate, an emulsion type, an emulsion formation time, an emulsion formation region, an interfacial tension, a composition of fluid, etc. Such types of values can be utilized in controlling an injection process that injects chemicals into a subterranean formation that includes a reservoir with oil. As an example, one or more methods can improve recovery of oil from a reservoir by utilizing a simulator that can simulate underground conditions. As an example, such a method may make a tertiary recovery process (e.g., an EOR process) more effective as to amount of oil recovered, rate of oil recovery, amount of oil in produced fluid(s), and/or amount of water and/or chemical utilized.

The system 700 of FIG. 7 can be utilized for purposes of chemical flooding to add a material (chemical) to water being injected into a reservoir to increase the oil recovery by one or more of (1) increasing the water viscosity (e.g., polymer and/or surfactant floods), (2) decreasing the relative permeability to water (cross-linked polymer and/or surfactant floods), or (3) increasing the relative permeability to oil and decreasing residual oil saturation (Sor) by decreasing the interfacial tension between the oil and water phases (e.g., microemulsion and/or alkaline floods).

FIG. 7 shows an example of a method that includes driving fluid in a subterranean region via injection of water and one or more chemicals via a well or wells 710, using water as a buffer to protect one or more chemicals 720, controlling chemical solution mobility 730 (e.g., via a pump or pumps, etc.), exposing one or more chemicals to an alkaline environment where one or more of the chemicals can form a surface active agent in situ to reduce interfacial tension (IFT) 740, and recovering additional oil via reduction in IFT via a production well 750. Such a method can include, for example, a preflush operation that may help to condition a reservoir prior to injection of one or more chemicals 760.

As shown, the production well in the system 700 of FIG. 7 can include associated equipment such as a sucker pump and the injection wells can include associated equipment such as injection pumps. Various surface equipment shown in the system 700 of FIG. 7 can include control equipment, surface processing equipment, collection equipment, computing equipment, reservoir simulator(s), etc.

In FIG. 7, some examples of equipment are labeled, including a well head assembly 752 of an injection well, an injection pump 754 operatively coupled to the well head assembly 752 of the injection well to inject fluid (e.g., water and/or water and chemicals) into the injection well where fluid may be held in one or more tanks as part of surface equipment 790 to supply the injection pump 754 and where computerized control equipment 780 can be operatively coupled to one or more of such surface equipment 790, well head assembly 752 and injection pump 754 to control one or more operations that can include one or more EOR operations.

Also shown in FIG. 7 are a well head assembly 772 for a production well and a production pump 774 that is operatively coupled to the well head assembly 772 to produce fluid(s) from the reservoir as may be subjected to one or more operations, which can include one or more EOR operations. The computerized control equipment 780 (e.g., as housed in a building, etc.) can be operatively coupled to various equipment including, for example, the well head assembly 772 and the production pump 774. As an example, the computerized control equipment 780 can include one or more simulators and/or be operatively coupled to one or more simulators that can simulate conditions in the reservoir as to one or more of oil, water, emulsion, microemulsion, etc. . . . . The computerized control equipment 780 can issue one or more control signals to one or more pieces of equipment using results from a simulator that operates according to a method or methods (see, e.g., the method 500 of FIG. 5).

As an example, the computerized control equipment 780 can include instructions executable to render one or more GUIs such as one or more of the GUIs 610 and 630 to a display, which may be a display of the computerized control equipment 780. For example, the wells in the system 700 may be represented as wells akin to the wells in the GUI 630 of FIG. 6 to provide for manual, semi-automated, and/or automated control of one or more pieces of equipment in the system 700. For example, saturations can be determined for various regions of the reservoir where injection and/or production may be controlled using one or more of those saturations (e.g., in a region or regions). For example, an injection rate of the injection pump 754 may be adjusted, a production rate of the production pump 774 may be adjusted (e.g., based on effectiveness of an EOR operation according to a simulator, etc.), a valve in the well head assembly 752 may be adjusted, a valve in the well head assembly 772 may be adjusted, an amount of water and/or amount of chemical flowing from a tank or tanks of surface equipment 790 may be adjusted (e.g., via one or more valves, one or more pumps, etc.), for example, to increase and/or decrease water and/or chemical injected into the reservoir via one or more injection wells. As an example, injection wells may be controlled differently according to regional results from a simulator. Such a simulator-based approach to control can improve one or more EOR operations for the reservoir shown in the example of FIG. 7. As an example, an improvement can be from a simulator that operates with less error and/or more rapidly to thereby allow for control that approaches real-time control for performing one or more EOR operations. As an example, an improvement can be from a simulator that operates with less error as to calculations of oil production rate where one or more pieces of equipment can be controlled in an improved manner (e.g., more accurately) based at least in part on oil production rate to thereby improve one or more EOR operations.

As an example, the computerized control equipment 780 can include one or more processors, memory that store instructions executable by a processor, and one or more interfaces, which can include interfaces for transmission of information and/or receipt of information from one or more pieces of equipment in the system 700, which may include one or more sensors, one or more actuators, etc. As an example, the computerized control equipment 780 can be a controller that issues control information via one or more interfaces to one or more pieces of equipment in the system 700. As an example, the computerized control equipment 780 can include one or more of the components of the system 250 of FIG. 2. As an example, the system 100 and/or the geologic environment 150 of FIG. 1 may include one or more of the components of the system 700 of FIG. 7 and vice versa.

As an example, a controller may aim to expedite recovery of oil, make recovery more efficient, make surface processing more efficient, etc. Such a controller may be operatively coupled to a reservoir simulator that is operated in an improved manner where the reservoir simulator includes instructions that are stored in memory and executable by one or more processors to provide an improved reservoir simulator.

As an example, a simulator can help to control a process via one or more actions, which may include preceding chemical injection with a preflush to buffer the chemicals from reactions with the in situ water and following the chemical injection with the injection of a polymer solution to maintain a favorable mobility ratio for the flood. As an example, a simulator may account for chemicals that are surface active and that, due to such properties, interact with one or more types of rock (e.g., reservoir rock). For example, a chemical can have an affinity for one or more types of minerals found in reservoirs, causing adsorption of chemicals from solution onto the rock in various quantities. A simulator can estimate subsurface conditions and can control one or more pieces of equipment, optionally in real-time and optionally with feedback data as acquired by one or more sensors that are subsurface and/or one or more sensors associated with producing fluid and/or processing fluid (e.g., consider determinations as to water fraction, oil fraction, state of chemicals, microemulsions, etc.).

As mentioned, a method such as the method 500 of FIG. 5 can include utilizing a kD-tree geometrical technique for dynamic grid refinement. In such an example, the kD-tree can allow for making a refinement lean, with a highest number of grid cells reduction compared with an original fine grid, and, therefore, achieve an optimal gain in performance.

As an example, a method such as the method 500 of FIG. 5 can include utilizing a technique that predict one or more fluid properties in a front position, for example, to serve as a basis for further kD-tree grid refinement with respect to the front. Such a technique can involve, for example, machine learning (ML). As an example, training data for the ML may be accumulated as the result of a limited number of fine-grid simulation runs. Additionally and/or alternatively, training may be via data generated for one or more other simulations, which may be for a common reservoir, for different reservoirs, for laboratory reservoirs, for synthetic reservoirs, etc.

As to a machine learning platform, consider a platform that includes one or more features of the AZURE AI platform (Microsoft Corp, Redmond, Wash.) and/or the TENSOR FLOW platform (Google, Mountain View, Calif.).

As an example, a method can include generating and/or accessing data and training a ML prediction model (e.g., Boosted Decision Tree, Decision Forest, Neural Network, etc.). For example, consider an approach that includes running a full-field simulation once with water and/or agent flood front with high-resolution (e.g., fine grid); processing results to construct a training dataset, including set of input parameters leading to a certain flood front position and orientation at a next time step where, for example, the flood front is approximated by a line in 2D (plane in 3D modelling), and described by two output variables; training the model using one of one or more techniques giving similar performance for a training dataset; and as the result of the trained model, predicting with a relatively high level of confidence where a future front position is depending on current physical parameters of both halo cells (cells surrounding region to be discretized), and region itself.

Figure 8:
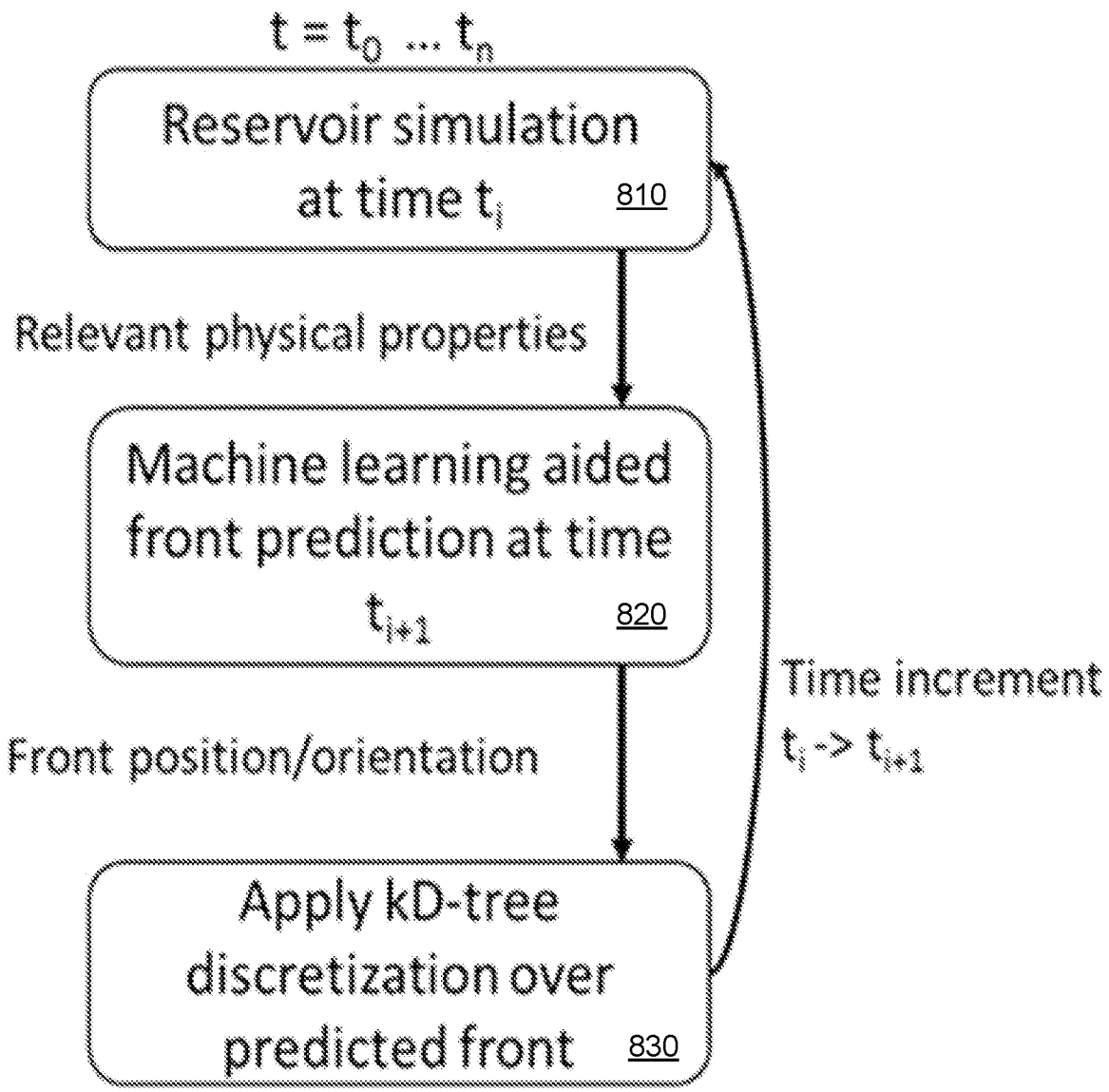
FIG. 8 illustrates an example of a method.

FIG. 8 shows an example of a method 800 that includes a simulation block 810, a prediction block 820 and a discretization block 830. As shown, the simulation block 810 involves simulating at a particular time to generate relevant physical properties; the prediction block 820 involves predicting a front position at a next time, which can include characterization of a front as to its orientation; and the discretization block 830 involves applying a discretization technique (e.g., kD-tree) over a region associated with the predicted front to thereby condition a simulator for solving for various values associated with the front at the next time (e.g., per the prediction block). The method 800 can then loop back to the simulation block 810 and continue as appropriate as long as a front exists and/or meets one or more criteria for purposes of prediction and discretization. For example, if a prediction results places the front at the same position (e.g., little change), the method 800 may return to the simulation block 810 without performing the discretization of the discretization block 830.

As an example, a method can include running a reservoir simulation using a simulator and extracting relevant properties (e.g., of halo cells) at time ti; predicting linear front position and orientation using one or more ML regression algorithms; discretizing one or more initially upscaled regions via a kD-tree algorithm to include fine scale grid cells in the vicinity of the predicted position of the front to thereby increase accuracy in reproducing and accounting for large values of gradients at the front where, for example, fine scale grid cells are amalgamated after front passes, as a part of common clean-up procedure; and advancing time to the next timestep ti+1 and then iterating until a desired end time step is reached.

The domain of Enhanced Oil Recovery (EOR) has gained a prominence recently because, firstly, a large number of brown fields have become objects of additional attempts to extract hydrocarbons trapped in reservoirs due to imperfectness of initial application of recovery methods. Secondly, current economic conditions do not allow large capital spending on exploration of new fields, the EOR methods often become more economically viable.

Normally, an application of EOR technique implies a reservoir flooding by a certain agent, which, as explained, could be water of varied salinity, polymer, surfactant, foam, etc. As explained, the agent propagates from an injector with a purpose to visit parts of reservoir which may have remained relatively inaccessible during primary recovery.

The simulation of EOR processes can be part of one or more types of workflows. For example, reservoir engineers have a number of methods available to carry out the flooding. Therefore, before starting injection, they can screen to decide which method is most viable. As another example, if the type of EOR flooding is known, simulation can assist to determine an amount of the injected agent, and to predict time of the agent arrival to producers.

As explained, modeling of reservoir flooding has its own challenges, which can be related to maximize both accuracy and performance of the simulation process. As explained, simulation can involve determining where and/or how a front or fronts progress where such a front may be an agent steep front; noting that it can occur quite regularly in reservoir flooding by an EOR agent that a front exists that is a sharp front of the agent in its concentration or in phase saturation.

Simulation of steep front propagation with high accuracy demands fine scale spatial discretization of a numerical model over the reservoir since the purpose can be for the front to visit the entire reservoir to facilitate a secondary (or tertiary) type of recovery. As explained, a fine scale grid leads to a large number of grid cells and simulation variables, large size of matrices to solve during simulation and, therefore, to a serious slow-down in the performance.

As explained, it can be beneficial to control a simulator such that grid cell size is appropriate for simulating underlying conditions and associated physical phenomena. For example, fine scale discretization can be beneficial at parts of the reservoir where gradients of concentration and other parameters are "large".

As an example, a fine scale grid around the front would help to minimize numerical dispersion which is amplified by the front steepness and/or help to reveal fine-scale features of the rock structure, otherwise averaged because of upscaling.

Figure 9:
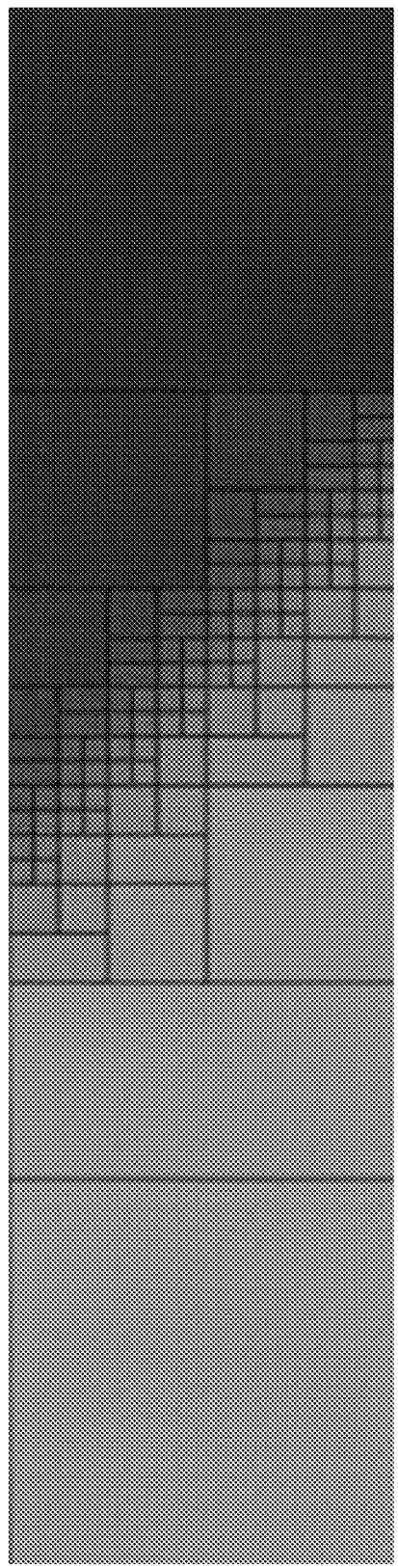
FIG. 9 illustrates an example of a front that is discretized at a resolution that is finer than other portions of a reservoir model.

FIG. 9 shows an example of a grid 900 with a front that is disposed between two different regions where the number of grid cells (e.g., grid cell density) is higher spatially at the front that at distances removed from the front where, for example, there can be a decrease in grid cell density that is proportional or otherwise based on a distance metric as measured from a position of the front. As explained, the grid can be generally fixed at its boundaries that may be reservoir boundaries while the interior portion of the grid can be adjusted to account for a time-dependent front, one that changes position within the grid with respect to time due to one or more physical phenomena (e.g., reactions, diffusion, temperature, pressure, injection, extraction, flow, etc.).

As explained, various techniques can be employed for dynamic, front-tracking grid refinement. As explained, a technique may include using amalgamation of an initially fine grid into coarser cells when properties gradients are not substantial. Reversal of the amalgamation—refinement down to the original fine scale, takes place when the steep fronts are nearby. Such grid manipulations are dealing with just two levels of refinement.

FIG. 10 shows two grids 1010 and 1030 where the grid 1010 corresponds to thermal simulation and the grid 1030 corresponds to compositional where each of the grid exhibit at least one front. Specifically, the grid 1010 is for dynamic amalgamation and de-amalgamation for SAGD and the grid 1030 is for compositional simulation.

An adaptive approach may be utilized for one or more types of simulations, as explained, and including, for example, unsteady gas dynamics, for incompressible flow in porous media, etc.

As an example, a so-called Algebraic Dynamic Multilevel (ADM) technique may be employed for a fully implicit simulation. The ADM offers a hierarchy of nested grids of different resolutions, the decision which grid to use is based on an error estimate criterion.

Figure 11:
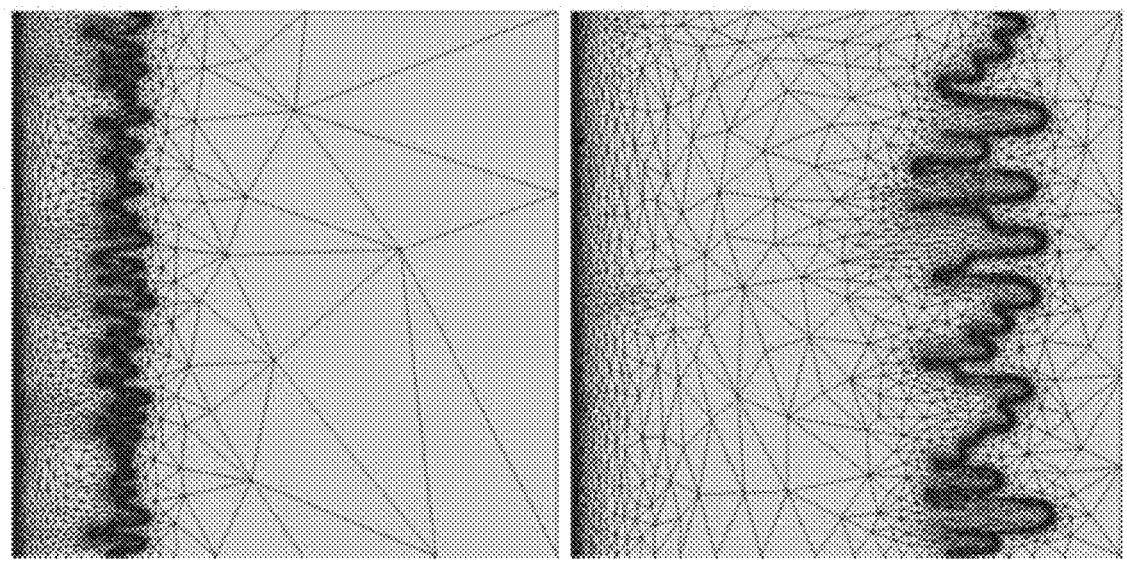
FIG. 11 illustrates examples of grids.

As shown with respect to the grids 1100 of FIG. 11, another technique is referred to as Adaptive Mesh Control Volume Finite Element (AMCVFE), which uses constantly morphed triangular anisotropic mesh re-generation, with scale and topology driven by evolving in time front of concentration.

Another technique is referred to as Dynamic Local Grid Refinement, DLGR, which uses a geometrical construction called octree.

As an example, a refinement process can take a refined area closer to its original geological granularity where coarse cells and domains are nothing more than initially upscaled parts of feature-rich rock structure. Down-scaling of the upscaled grid around the frontline can both minimize numerical errors caused by front steepness and restore front propagation sensitivity to fine-scale reservoir features.

As explained, a challenge in dynamic grid refinement can be to predict where a front will be at the next time step and then an ability to refine the grid where the front is expected. Such an approach can involve local grid refinement where, for example, a front is disposed between two or more regions that differ. For example, a difference may be represented by a gradient that is a spatial gradient. As mentioned, a method can include machine learning to generate a trained ML model that can be implemented by a simulator to predict where a front may be in a future time (e.g., future with respect to a current simulator simulation time). Such an approach can be implemented to predict the future front position in a numerical simulation that may utilize an implicit solver. In implicit solvers, the duration (e.g., length) of a time step may not necessarily be constrained by particular stability demands; therefore, a current front and a future position of that front could be possibly far apart in one time step.

As mentioned some techniques have addresses dynamic grids for front. For example, a technique can include duplicating a system advance at each time step where, after a first time step on an "old" grid, the states and inter-cell fluxes are analyzed, and the front position is predicted as the result. The grid is then refined according to this prediction, and the time step is repeated. As mentioned, a technique may implement a streamline simulation run of a reservoir model where, for example, a streamline run is performed on a "lighter" version of the full discretized model to monitor agent concentration front propagation along one-dimensional streamlines. In that technique, the front position along a set of streamlines is then mapped into a cell model with an octree grid refinement around the front.

As an example, machine learning can be implemented for front position prediction. In such an example, a simulator can predict future front position with a relatively high level of confidence without having to run a heavy calculation-intensive simulation on a fine-grid. The results of a trained machine model can be utilized for determining where to perform kD-tree discretization, which can provide an efficiency gain with minimal impact on accuracy.

Figure 12:
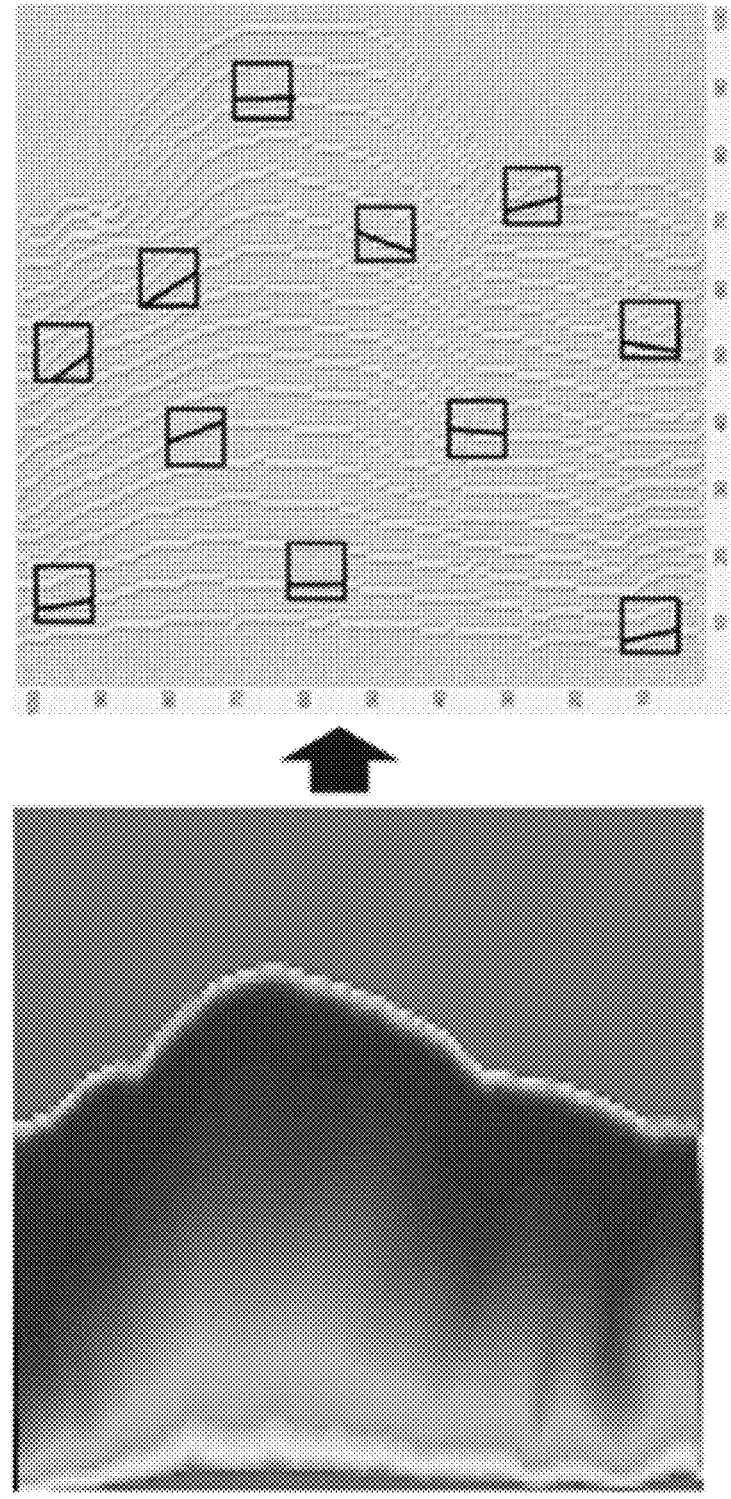
FIG. 12 illustrates an example of a method.
Figure 13:
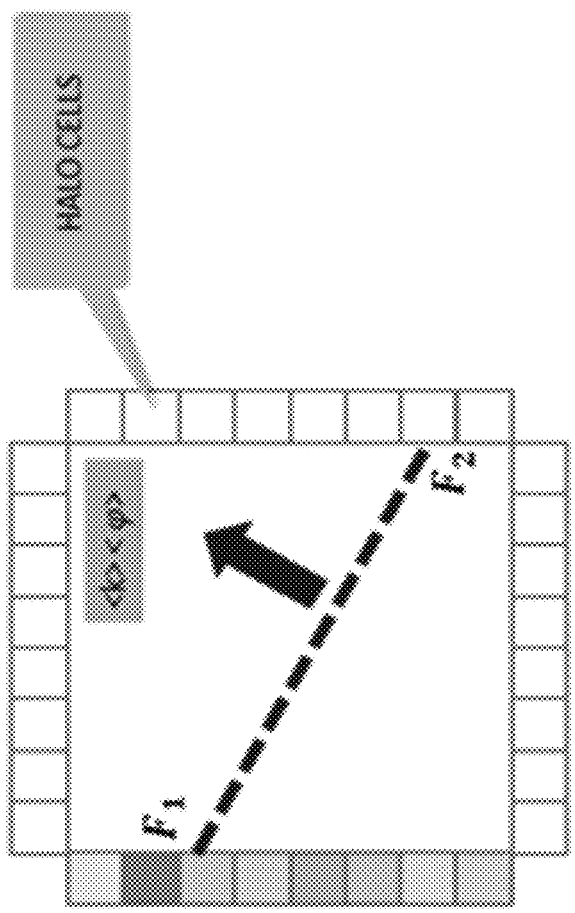
FIG. 13 illustrates an example of a method.

As an example, FIG. 12 shows a method 1200 that can include preparing a model via running a full-field simulation with a high resolution grid; processing results to construct a training dataset (e.g., that includes a number of input parameters leading to a certain flood front position and orientation at the next time step) where, for example, a flood front may be approximated by a line in 2D (plane in 3D), and described by two output variables $F_1$ and $F_2$ (see the method 1300 of FIG. 13).

As an example, a method can include training a machine model using one or more regression techniques (e.g., such as Boosted Decision Tree, Decision Forest, Neural Network, etc.), which can ensure a good predictive performance for the training dataset (see, e.g. FIG. 13).

As an example, input variables (e.g., "features"), a method can utilize current physical parameters of a region to be discretized and, for example, halo cells that are adjacent to the region (e.g., within a defined neighborhood of the region/front). As an example, halo cells may form a contiguous "ring" about a front region. Output may be multi-parameter, for example, where two parameters may be utilized to draw a line in 2D representing flood front (see, e.g., FIG. 13).

As mentioned, a kD-tree grid refinement technique may be implemented as to discretization. The kD-tree is a geo-metric concept for recursive 2D or 3D space discretization. Data associated with a kD-tree can be organized in a tree-like binary graph, with branches extension decision based on interest in a particular domain in space user-defined level of space refinement.

FIG. 14 shows various examples of Illustrations of kD-tree space discretization 1410 and 1430 aiming to create fine grid around a point (in bottom left corner) and line. Specifically, FIG. 14 shows a kD-tree space refinement around a point and line in 2D.

As mentioned, kD-tree space discretization allows for achieving high levels of grid refinement, with a gain in accuracy, in a selected part of the discretized domain. The kD-tree refinement is a lean algorithm, capable of refining a grid where desired, leaving other, less interesting parts of the domain upscaled. To quantify a selectivity of an algorithm, a method may utilize a Lean Parameter (LF) which is a degree of the number of cells reduction compared with the fine grid where discretized, with equal smallest linear scale.

$$LF = \frac{N_{fine}}{N_{selective}},$$

where $N_{fine}$ is a total number of cells with uniform discretization, and $N_{selective}$ is a number of cells after discretization targeting certain area of the domain.

It can be shown that for space refinement around a point (0D object) $LF \approx N^2/\log(N)$ where N is a number of cells in one direction in uniform N×N unit square discretization, and for space refinement around a line (1D object): $LF \approx N/\log(N)$. For the grid refinement around diagonal shown on FIG. 14 (see also FIG. 15), a precise value of LF can be calculated taking into account that $N_{selective}=294$, and $N_{fine}$ would have to be equal to 64×64. It gives us $LF \approx 14$, which means that the simulation on a grid generated with kD-tree would demand 14 time less cells, still achieving an equivalent accuracy for simulation near the diagonal front.

FIG. 15 shows a kD-tree space refinement around a diagonal line in a grid 1510 with $LF \approx 14$, and Lean Factor in a plot 1530 as a function of the refinement depth. As indicated, gains in reducing cells number are larger for finer grid resolution.

As explained, a method such as the method 500 of FIG. 5 can operate a simulator to provide for fast simulation of water/EOR agent front. While retaining high accuracy of simulation, such a method can reduce a number of grid cells, for example, up to few dozen times or more. Such an approach can implement one or more ML regression algorithms to predict front position at future time step and carry out kD-tree discretization around a predicted front position.

As an example, a method of operating a reservoir simulator can include performing a time step of a reservoir simulation using a spatial reservoir model that represents a subterranean environment that includes a reservoir to generate simulation results for a first time where the simulation results include a front defined by at least in part by a gradient at a position between portions of the spatial reservoir model; predicting a position of the front for a subsequent time step for a corresponding second time using a trained machine model; discretizing the spatial reservoir model locally at the predicted position of the front to generate a locally discretized version of the spatial reservoir model; and performing a time step of the reservoir simulation using the locally discretized version of the spatial reservoir model to generate simulation results for the second time. In such a method, the front can be spatially defined in one or more dimensions. In such a method, multiple fronts may exist, where each front may be a particular type of front or where each front may be of a common type, yet discrete for one or more reasons (e.g., as to injection, as to reactions, as to temperature, as to production, etc.).

As an example, a method can include utilizing seismic data from one or more seismic surveys. For example, multiple spatial surveys may be acquired over a period of time, which may be production time, injection time, etc. In such examples, a reservoir may experience phenomena such as compaction and/or expansion. As an example, a front or fronts may be adjusted utilizing such time dependent characteristics of an actual reservoir.

As an example, a method can include training a machine model to generate a trained machine model. For example, consider generating training data via operation of a reservoir simulator. In such an example, generating can include utilizing a spatial reservoir model that has a fine resolution and where performing a time step of a reservoir simulation using a spatial reservoir model utilizes a coarser resolution spatial reservoir model. As an example, a fine resolution model of a reservoir can include a greater number of cells (e.g., elements) than a coarser resolution model of the reservoir. As an example, the coarser resolution reservoir model may be subjected to adaptation in an intelligent manner utilizing a trained machine model such that, for example, discretization that increases resolution of a portion of the coarser reservoir model is based on output of the trained machine model where that portion is expected to include a front (e.g., a gradient region, etc.) at a particular time step during reservoir simulation where the front is a moving front.

As an example, a method can include discretizing using kD-tree discretization or, for example, boosted tree, random forest, etc.

As an example, a front can include water such that the front can be referred to as a water front. For example, in a waterflooding operation, water can be injected into a reservoir for purposes of enhancing recovery of oil that exists in the reservoir, which may be produced by a production well. As an example, it may be desirable to track the front to determine when water fraction of produced fluid by the production well may increase. As to an increased water fraction, it may impact processing of produced fluid, for example, separating the water from the produced fluid such that a remaining fraction is predominantly oil. As water fraction increases, the separation of produced fluid can become more complicated (e.g., costly, less effective) and the amount of oil produced can decrease.

As an example, a front can include surfactant. As an example, a front can include gas. As an example, a front can be an enhanced oil recovery (EOR) front. As an example, a front may be defined by a salinity gradient. For example, at a first spatial point a salt concentration can be higher than at another, second spatial point which is a distance from the first spatial point. In such an example, a front may be defined to be between the two spatial points, optionally at or near a mid-point. As an example, during reservoir simulation and/or actual operations, the front may move spatially with respect to time. As an example, a model (e.g., trained machine model, etc.) may be utilized to determine a location of the front and/or to discretize a reservoir model grid for enhancing computations of a reservoir simulator (e.g., to make the reservoir simulator operate more efficiently and/or more accurately as to a moving front).

As an example, a method can include machine aided front prediction and discretization of a simulation grid (e.g., or mesh) at a region of the simulation grid that corresponds to where the front will be according to the front prediction. Such a method can be a hybrid method in that a simulator performs computations to determine where the front is at a particular time (e.g., time step) and in that a trained machine model predicts where the front will be at a future time that is in advance of a current time step of the simulator. In such an example, the operation of the simulator and trained machine model can be interleaved where output of the trained machine model controls adjustments to a simulation grid of the simulator. As an example, a method can include simulate front for time step t, predict front location for next time step t+1, adjust grid to more accurately model advance of front, simulate front for time step t+1, etc.

As an example, a method can include controlling a field operation of an enhanced oil recovery process using generated simulation results for one or more times where the generated simulation results include at least some time steps where a grid of a reservoir simulator is adjusted to discretize a region thereof as to an expected arrival of a front, as may be associated with the EOR process. As an example, a reservoir simulator can include at least one processor and memory accessible to at least one of the at least one processor. As an example, a reservoir simulator can be a specialized machine that is configured to operate to simulate physical phenomena in one or more reservoirs.

As an example, a system can include a processor; memory operatively coupled to the processor; and processor-executable instructions stored in the memory to instruct the system, where the instructions include instructions to: perform a time step of a reservoir simulation using a spatial reservoir model that represents a subterranean environment that includes a reservoir to generate simulation results for a first time where the simulation results include a front defined by at least in part by a gradient at a position between portions of the spatial reservoir model; predict a position of the front for a subsequent time step for a corresponding second time using a trained machine model; discretize the spatial reservoir model locally at the predicted position of the front to generate a locally discretized version of the spatial reservoir model; and perform a time step of the reservoir simulation using the locally discretized version of the spatial reservoir model to generate simulation results for the second time.

As an example, one or more computer-readable storage media can include computer-executable instructions to instruct a computer, where the instructions include instructions to: perform a time step of a reservoir simulation using a spatial reservoir model that represents a subterranean environment that includes a reservoir to generate simulation results for a first time where the simulation results include a front defined by at least in part by a gradient at a position between portions of the spatial reservoir model; predict a position of the front for a subsequent time step for a corresponding second time using a trained machine model; discretize the spatial reservoir model locally at the predicted position of the front to generate a locally discretized version of the spatial reservoir model; and perform a time step of the reservoir simulation using the locally discretized version of the spatial reservoir model to generate simulation results for the second time.

Figure 16:
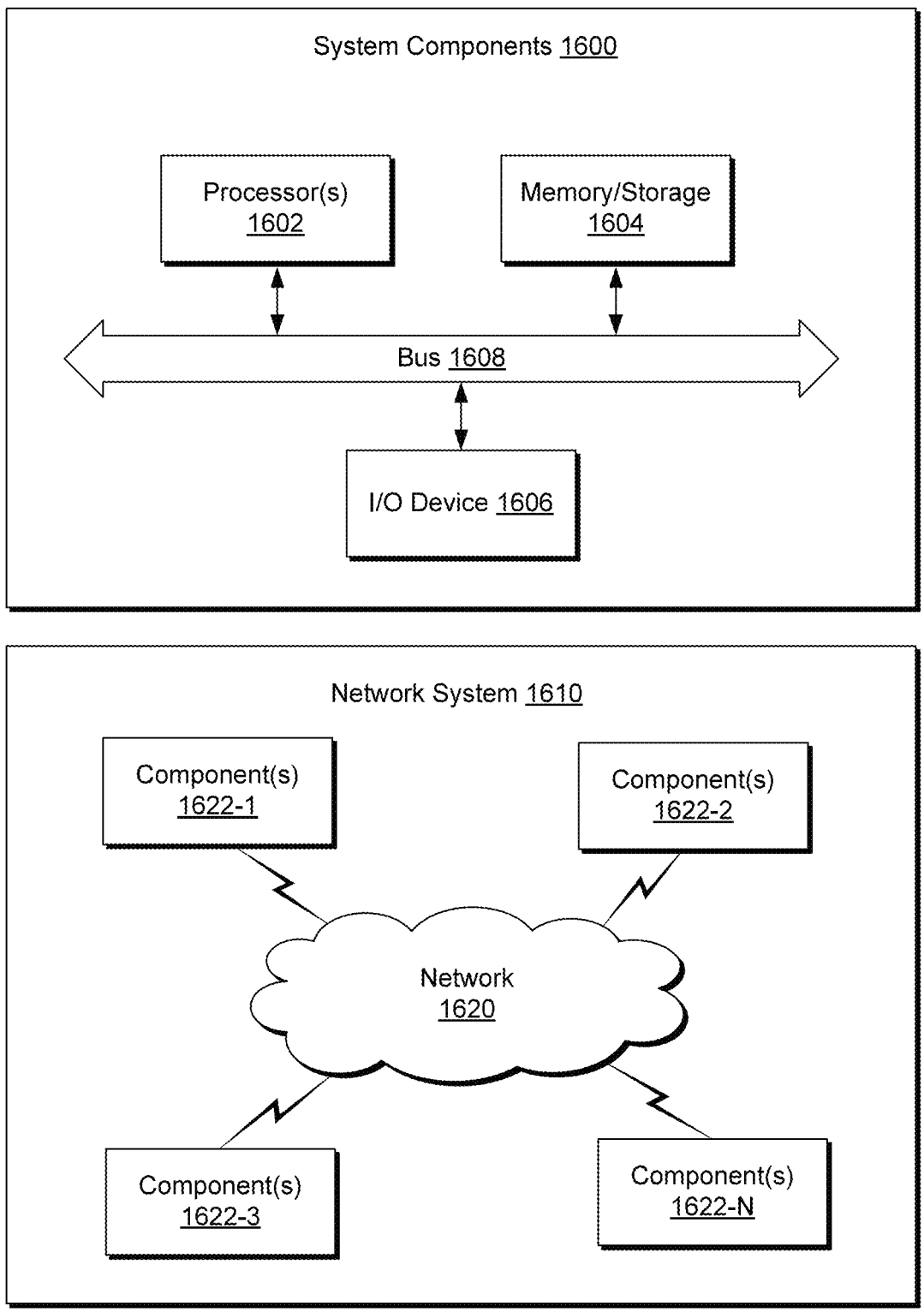
FIG. 16 illustrates example components of a system and a networked system.

FIG. 16 shows components of an example of a computing system 1600 and an example of a networked system 1610, either of which may be utilized in one or more systems, methods, etc., as described herein. The system 1600 includes one or more processors 1602, memory and/or storage components 1604, one or more input and/or output devices 1606 and a bus 1608. In an example embodiment, instructions may be stored in one or more computer-readable media (e.g., memory/storage components 1604). Such instructions may be read by one or more processors (e.g., the processor(s) 1602) via a communication bus (e.g., the bus 1608), which may be wired or wireless. The one or more processors may execute such instructions to implement (wholly or in part) one or more attributes (e.g., as part of a method). A user may view output from and interact with a process via an I/O device (e.g., the device 1606). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1610. The network system 1610 includes components 1622-1, 1622-2, 1622-3, . . . 1622-N. For example, the components 1622-1 may include the processor(s) 1602 while the component(s) 1622-3 may include memory accessible by the processor(s) 1602. Further, the component(s) 1602-2 may include an I/O device for display and optionally interaction with a method. The network 1620 may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

BIBLIOGRAPHY (DOCUMENTS INCORPORATED BY REFERENCE)

J. Bentley, Multidimensional binary search trees used for associative searching, in Communications of the ACM, 18, (9), p. 509-517, 1975

J. R. Christensen, G. Darche, B. Dechelette, H. Ma, P. H. Sammon. Applications of Dynamic Gridding to Thermal Simulations. SPE 86969-MS, 2004

P. H. Sammon. Dynamic Grid Refinement and Amalgamation for Compositional Simulation, SPE 79683, 2003.

M. J. Berger and P. Colella, Local Adaptive mesh refinement for shock hydrodynamics. J. Comp. Physics. 82, 64 (1989).

R. D. Hornung and J. A, Trangenstein. Adaptive Mesh Refinement and Multilevel Iteration for Flow in Porous Media. J. Comp. Physics. 136, 522-545 (1997).

M. Cusini, C. van Kruijsdijk, and H. Hajibeygi. Algebraic dynamic multilevel (ADM) method for fully implicit simulations of multiphase flow in porous media. Journal of Computational Physics, 314, 60-79 (2016)

P. Mostaghimi, F. Kamali, M. D. Jackson, A. H. Muggeridge, and C. C. Pain. A Dynamic Mesh Approach for Simulation of Immiscible Viscous Fingering. SPE-173281-MS, 2015

D. W. van Batenburg, M. Bosch, P. M. Boerrigter, A. H. de Zwart, and J. C. Vink. Application of Dynamic Gridding Techniques to IOR/EOR-Processes. SPE 141711, 2011.

Karin G. Gonzalez. Adaptive Grid Refinement Improves Gas Injection Modeling, SPE 184487-STU, 2016 https://en.wikipedia.org/wiki/Machine_learning https://azure.microsoft.com/en-gb/services/machine-learning/ https://en.wikipedia.org/wiki/Regression_analysis https://en.wikipedia.org/wiki/Artificial_neural_network

What is claimed is:

1. A method of operating a reservoir simulator comprising:
    performing a time step of a reservoir simulation using a spatial reservoir model that represents a subterranean environment that comprises a reservoir to generate simulation results for a first time wherein the simulation results comprise a front defined by at least in part by a gradient at a position between portions of the spatial reservoir model;
    predicting a position of the front for a subsequent time step for a corresponding second time using a trained machine model;
    discretizing the spatial reservoir model locally at the predicted position of the front to generate a locally discretized version of the spatial reservoir model; and performing a time step of the reservoir simulation using the locally discretized version of the spatial reservoir model to generate simulation results for the second time.

2. The method of claim 1 comprising training a machine model to generate the trained machine model.

3. The method of claim 2 comprising generating training data via operation of the reservoir simulator.

4. The method of claim 3 wherein the generating comprises utilizing a spatial reservoir model that comprises a fine resolution and wherein the performing a time step of a reservoir simulation using a spatial reservoir model utilizes a coarser resolution spatial reservoir model.

5. The method of claim 1 wherein the discretizing comprises kD-tree discretization.

6. The method of claim 1 wherein the front comprises water.

7. The method of claim 1 wherein the front comprises surfactant.

8. The method of claim 1 wherein the front comprises gas.

9. The method of claim 1 wherein the front comprises an enhanced oil recovery (EOR) front.

10. The method of claim 1 wherein the front is defined by a salinity gradient.

11. The method of claim 1 comprising controlling a field operation of an enhanced oil recovery process using the generated simulation results for the second time.

12. The method of claim 1 wherein the reservoir simulator comprises at least one processor and memory accessible to at least one of the at least one processor.

13. A system comprising:
a processor;
memory operatively coupled to the processor; and
processor-executable instructions stored in the memory to instruct the system, the instructions comprising instructions to:
perform a time step of a reservoir simulation using a spatial reservoir model that represents a subterranean environment that comprises a reservoir to generate simulation results for a first time wherein the simulation results comprise a front defined by at least in part by a gradient at a position between portions of the spatial reservoir model;
predict a position of the front for a subsequent time step for a corresponding second time using a trained machine model;
discretize the spatial reservoir model locally at the predicted position of the front to generate a locally discretized version of the spatial reservoir model; and
perform a time step of the reservoir simulation using the locally discretized version of the spatial reservoir model to generate simulation results for the second time.

14. The system of claim 13 wherein the instructions comprise instructions to train a machine model to generate the trained machine model.

15. The system of claim 14 wherein the instructions comprise instructions to generate training data via operation of the reservoir simulator.

16. The system of claim 13 wherein the instructions to discretize utilize kD-tree discretization.

17. One or more non-transitory computer-readable storage media comprising computer-executable instructions to instruct a computer, the instructions comprising instructions to:
perform a time step of a reservoir simulation using a spatial reservoir model that represents a subterranean environment that comprises a reservoir to generate simulation results for a first time wherein the simulation results comprise a front defined by at least in part by a gradient at a position between portions of the spatial reservoir model;
predict a position of the front for a subsequent time step for a corresponding second time using a trained machine model;
discretize the spatial reservoir model locally at the predicted position of the front to generate a locally discretized version of the spatial reservoir model; and
perform a time step of the reservoir simulation using the locally discretized version of the spatial reservoir model to generate simulation results for the second time.

18. The one or more non-transitory computer-readable storage media of claim 17 wherein the instructions comprise instructions to train a machine model to generate the trained machine model.

19. The one or more non-transitory computer-readable storage media of claim 18 wherein the instructions comprise instructions to generate training data via operation of the reservoir simulator.

20. The one or more non-transitory computer-readable storage media of claim 17 wherein the instructions to discretize utilize kD-tree discretization.

* * * * *